United States Patent
Flitsch

(10) Patent No.: US 9,457,442 B2
(45) Date of Patent: Oct. 4, 2016

(54) METHOD AND APPARATUS TO SUPPORT PROCESS TOOL MODULES IN A CLEANSPACE FABRICATOR

(75) Inventor: Frederick A. Flitsch, New Windsor, NY (US)

(73) Assignee: Futrfab, Inc., New Windsor, NY (US)

( * ) Notice: Subject to any disclaimer, the term of this patent is extended or adjusted under 35 U.S.C. 154(b) by 1686 days.

(21) Appl. No.: 12/691,623

(22) Filed: Jan. 21, 2010

(65) Prior Publication Data

US 2010/0209226 A1    Aug. 19, 2010

Related U.S. Application Data

(63) Continuation-in-part of application No. 11/156,205, filed on Jun. 6, 2005, now Pat. No. 7,513,822.

(60) Provisional application No. 61/146,183, filed on Jan. 21, 2009.

(51) Int. Cl.
| | |
|---|---|
| H01L 21/683 | (2006.01) |
| F16J 15/00 | (2006.01) |
| B23Q 3/155 | (2006.01) |
| H01L 21/67 | (2006.01) |
| H01L 21/677 | (2006.01) |

(52) U.S. Cl.
CPC ......... B23Q 3/155 (2013.01); H01L 21/67017 (2013.01); H01L 21/67775 (2013.01); *Y10T 403/52* (2015.01); *Y10T 483/17* (2015.01)

(58) Field of Classification Search
None
See application file for complete search history.

(56) References Cited

U.S. PATENT DOCUMENTS

| | | | |
|---|---|---|---|
| 3,158,457 A | 11/1964 | Whitefield | |
| 3,588,176 A | 6/1971 | Byrne et al. | |
| 3,603,646 A | 9/1971 | Leoff | |
| 3,812,947 A | 5/1974 | Nygaard | |
| 3,930,684 A | 1/1976 | Lasch, Jr. et al. | |
| 3,976,330 A | 8/1976 | Babinski et al. | |
| 4,081,201 A | 3/1978 | Hassan et al. | |
| 4,165,132 A | 8/1979 | Hassan et al. | |
| 4,278,366 A | 7/1981 | Loveless et al. | |
| 4,299,518 A | 11/1981 | Whelan | |
| 4,315,705 A | 2/1982 | Flint | |
| 4,348,139 A | 9/1982 | Hassan et al. | |
| 4,409,889 A | 10/1983 | Burleson | |
| 4,501,527 A | 2/1985 | Jacoby et al. | |
| 4,554,766 A | 11/1985 | Ziemer et al. | |
| 4,612,946 A | 9/1986 | Noh et al. | |
| 4,620,353 A | 11/1986 | Pryor | |
| 4,649,830 A | 3/1987 | Tanaka | |
| 4,667,579 A | 5/1987 | Daw | |
| 4,667,580 A | 5/1987 | Wetzel | |
| 4,682,927 A * | 7/1987 | Southworth et al. | ......... 414/217 |

(Continued)

FOREIGN PATENT DOCUMENTS

WO    WO 2004109748 A2 * 12/2004

*Primary Examiner* — Gregory Huson
*Assistant Examiner* — Eric Gorman
(74) *Attorney, Agent, or Firm* — Joseph P. Kincart; Ideation Law, PLLC

(57) ABSTRACT

The present invention provides various aspects of support for a processing tool in a fabrication facility capable of routine placement and replacement of processing tools and component assemblies of the tools. Support aspects include a support structure for component assemblies and a quick disconnect flange which facilitates connecting and disconnect of electrical, liquid and gas utilities to a tool component placed in the processing tool.

13 Claims, 17 Drawing Sheets

(56) References Cited

U.S. PATENT DOCUMENTS

| | | | |
|---|---|---|---|
| 4,694,736 A | 9/1987 | Yamagata et al. | |
| 4,695,215 A | 9/1987 | Jacoby et al. | |
| 4,699,640 A | 10/1987 | Suzuki et al. | |
| 4,722,659 A | 2/1988 | Hoyt, III et al. | |
| 4,804,392 A | 2/1989 | Spengler | |
| 4,826,360 A | 5/1989 | Iwasawa et al. | |
| 4,840,530 A | 6/1989 | Nguyen | |
| 4,851,018 A * | 7/1989 | Lazzari et al. | 55/356 |
| 4,861,222 A | 8/1989 | Mirkovich | |
| 4,867,629 A * | 9/1989 | Iwasawa et al. | 414/331.05 |
| 4,875,825 A | 10/1989 | Tullis et al. | |
| 4,923,352 A * | 5/1990 | Tamura et al. | 414/225.01 |
| 4,963,069 A | 10/1990 | Wurst et al. | |
| 4,964,776 A * | 10/1990 | Wakita et al. | 414/277 |
| 5,029,518 A | 7/1991 | Austin | |
| 5,058,491 A | 10/1991 | Wiemer et al. | |
| 5,096,477 A | 3/1992 | Shinoda et al. | |
| 5,108,513 A | 4/1992 | Muller et al. | |
| 5,133,561 A * | 7/1992 | Hattori et al. | 277/646 |
| 5,139,459 A | 8/1992 | Takahashi et al. | |
| 5,145,303 A * | 9/1992 | Clarke | 414/217 |
| 5,167,575 A | 12/1992 | MacDonald | |
| 5,217,273 A * | 6/1993 | Hendricsen et al. | 294/186 |
| 5,344,365 A * | 9/1994 | Scott et al. | 454/187 |
| 5,358,420 A | 10/1994 | Cairns et al. | |
| 5,425,793 A | 6/1995 | Mori et al. | |
| 5,513,946 A * | 5/1996 | Sawada et al. | 414/744.5 |
| 5,518,451 A | 5/1996 | Renz et al. | |
| 5,527,390 A * | 6/1996 | Ono et al. | 118/719 |
| 5,562,539 A | 10/1996 | Hashimoto et al. | |
| 5,570,990 A | 11/1996 | Bonora et al. | |
| 5,615,988 A * | 4/1997 | Wiesler | H01L 21/67778 414/416.03 |
| 5,647,718 A * | 7/1997 | Wiesler | H01L 21/67778 414/416.08 |
| 5,741,109 A * | 4/1998 | Wiesler | H01L 21/67778 414/416.08 |
| 5,779,799 A * | 7/1998 | Davis | 118/663 |
| 5,795,356 A | 8/1998 | Leveen | |
| 5,827,118 A * | 10/1998 | Johnson et al. | 454/187 |
| 5,848,933 A | 12/1998 | Roberson et al. | |
| 5,860,258 A | 1/1999 | Faith et al. | |
| 6,019,563 A * | 2/2000 | Murata | B23Q 7/1436 414/222.01 |
| 6,040,235 A | 3/2000 | Badehi | |
| 6,053,688 A * | 4/2000 | Cheng | H01L 21/67772 118/719 |
| 6,082,949 A | 7/2000 | Rosenquist | |
| 6,082,951 A * | 7/2000 | Nering | H01L 21/67772 414/217.1 |
| 6,091,498 A * | 7/2000 | Hanson et al. | 356/623 |
| 6,099,599 A | 8/2000 | Wu | |
| 6,138,721 A | 10/2000 | Bonora et al. | |
| 6,183,358 B1 | 2/2001 | Adair, Jr. | |
| 6,186,723 B1 | 2/2001 | Murata et al. | |
| 6,203,582 B1 * | 3/2001 | Berner et al. | 29/25.01 |
| 6,220,808 B1 | 4/2001 | Bonora et al. | |
| 6,238,283 B1 | 5/2001 | Matsuyama et al. | |
| 6,283,701 B1 * | 9/2001 | Sundar | H01L 21/68707 294/103.1 |
| 6,306,189 B1 | 10/2001 | Renz | |
| 6,312,525 B1 | 11/2001 | Bright et al. | |
| 6,322,597 B1 * | 11/2001 | Ohta | 29/25.01 |
| 6,328,768 B1 | 12/2001 | Ohta | |
| 6,338,371 B1 | 1/2002 | Araki et al. | |
| 6,382,895 B1 * | 5/2002 | Konishi et al. | 414/217 |
| 6,431,948 B1 * | 8/2002 | Atoh | 451/5 |
| 6,574,937 B1 | 6/2003 | Rapisarda et al. | |
| 6,582,178 B2 | 6/2003 | Petruccelli | |
| 6,585,470 B2 * | 7/2003 | Van Der Meulen | H01L 21/67778 414/217 |
| 6,591,162 B1 | 7/2003 | Martin | |
| 6,598,279 B1 | 7/2003 | Morgan | |
| 6,612,084 B2 | 9/2003 | Rapisarda | |
| 6,654,122 B1 * | 11/2003 | Hanson et al. | 356/614 |
| 6,672,820 B1 * | 1/2004 | Hanson et al. | 414/222.06 |
| 6,677,690 B2 | 1/2004 | Fosnight et al. | |
| 6,736,582 B1 | 5/2004 | Mages et al. | |
| 6,755,221 B2 | 6/2004 | Jeong et al. | |
| 6,776,850 B2 | 8/2004 | Liao et al. | |
| 6,854,583 B1 * | 2/2005 | Horn | 198/348 |
| 6,869,457 B2 | 3/2005 | Nakagawa | |
| 6,875,282 B2 | 4/2005 | Tanaka et al. | |
| 6,902,762 B2 * | 6/2005 | Miyata | 427/240 |
| 6,955,595 B2 | 10/2005 | Kim | |
| 7,014,672 B2 | 3/2006 | Ishihara et al. | |
| 7,039,999 B2 | 5/2006 | Tarr et al. | |
| 7,077,173 B2 * | 7/2006 | Tokunaga | 141/66 |
| 7,083,515 B2 | 8/2006 | Rapisarda et al. | |
| 7,257,458 B1 | 8/2007 | Markle | |
| 7,269,925 B2 * | 9/2007 | Lam | 52/79.1 |
| 7,648,327 B2 * | 1/2010 | Bonora et al. | 414/744.3 |
| 8,163,631 B2 | 4/2012 | Chiang et al. | |
| 8,596,312 B2 | 12/2013 | Natsume et al. | |
| 9,105,673 B2 * | 8/2015 | Babbs | H01L 21/67379 414/217 |
| 2002/0009357 A1 * | 1/2002 | Hanson et al. | 414/639 |
| 2002/0020751 A1 | 2/2002 | Matsumoto | |
| 2002/0025244 A1 | 2/2002 | Kim | |
| 2002/0088543 A1 * | 7/2002 | Ashjaee et al. | 156/345.31 |
| 2002/0129707 A1 | 9/2002 | Tanaka et al. | |
| 2002/0143656 A1 | 10/2002 | Matsuo et al. | |
| 2002/0197136 A1 | 12/2002 | Huang et al. | |
| 2003/0012625 A1 * | 1/2003 | Rosenquist | H01L 21/67259 414/217.1 |
| 2003/0031538 A1 * | 2/2003 | Weaver | H01L 21/67766 414/217.1 |
| 2003/0044261 A1 * | 3/2003 | Bonora | H01L 21/67766 414/217.1 |
| 2003/0044268 A1 * | 3/2003 | Bonora | H01L 21/67766 414/217 |
| 2003/0053894 A1 | 3/2003 | Matsumoto | |
| 2003/0082030 A1 * | 5/2003 | del Puerto et al. | 414/217 |
| 2003/0091409 A1 * | 5/2003 | Danna | H01L 21/67736 414/217 |
| 2003/0091410 A1 * | 5/2003 | Larson et al. | 414/217 |
| 2003/0101938 A1 * | 6/2003 | Ronsse et al. | 118/726 |
| 2003/0129045 A1 * | 7/2003 | Bonora | H01L 21/67766 414/217 |
| 2003/0156928 A1 * | 8/2003 | Sackett | H01L 21/67769 414/217 |
| 2003/0198541 A1 | 10/2003 | Davis et al. | |
| 2003/0202866 A1 | 10/2003 | Weng et al. | |
| 2003/0230031 A1 * | 12/2003 | Lam | 52/79.1 |
| 2004/0006544 A1 * | 1/2004 | Gulett | 705/400 |
| 2004/0013498 A1 * | 1/2004 | Soucy | H01L 21/67775 414/217 |
| 2004/0047714 A1 | 3/2004 | Poli et al. | |
| 2004/0062627 A1 | 4/2004 | Aggarwal et al. | |
| 2004/0081546 A1 * | 4/2004 | Elliott | H01L 21/67775 414/805 |
| 2004/0094087 A1 * | 5/2004 | Ivanov et al. | 118/300 |
| 2004/0157463 A1 * | 8/2004 | Jones | 438/716 |
| 2004/0187451 A1 | 9/2004 | Suzuki et al. | |
| 2004/0207836 A1 | 10/2004 | Chhibber et al. | |
| 2004/0225462 A1 | 11/2004 | Renken et al. | |
| 2004/0226510 A1 * | 11/2004 | Hanson et al. | 118/719 |
| 2004/0250762 A1 * | 12/2004 | Shigetomi et al. | 118/684 |
| 2005/0005957 A1 * | 1/2005 | Yamagata et al. | 134/200 |
| 2005/0014370 A1 * | 1/2005 | Jones | 438/689 |
| 2005/0048880 A1 * | 3/2005 | Tolles et al. | 451/66 |
| 2005/0095976 A1 * | 5/2005 | Tzeng | H01L 21/67781 454/187 |
| 2006/0099054 A1 * | 5/2006 | Friedman | H01L 21/67276 414/217 |
| 2006/0120833 A1 * | 6/2006 | Bonora | H01L 21/67766 414/217 |
| 2006/0130750 A1 * | 6/2006 | Ishikawa et al. | 118/300 |
| 2006/0182535 A1 * | 8/2006 | Rice et al. | 414/217 |
| 2006/0182536 A1 * | 8/2006 | Rice et al. | 414/217 |
| 2006/0213842 A1 * | 9/2006 | Shani et al. | 211/1 |
| 2006/0286920 A1 * | 12/2006 | Flitsch | 454/187 |

(56) References Cited

U.S. PATENT DOCUMENTS

| | | |
|---|---|---|
| 2007/0046284 A1 | 3/2007 | Renken et al. |
| 2007/0055404 A1* | 3/2007 | Flitsch .......................... 700/213 |
| 2007/0059130 A1* | 3/2007 | Flitsch .......................... 414/217 |
| 2007/0147976 A1* | 6/2007 | Rice et al. .................... 414/217 |
| 2007/0147982 A1* | 6/2007 | Rice et al. .................... 414/800 |
| 2007/0269296 A1* | 11/2007 | Flitsch ...................... 414/222.01 |
| 2008/0089765 A1 | 4/2008 | Moriya et al. |
| 2008/0166208 A1* | 7/2008 | Lester et al. ................. 414/217 |
| 2008/0166210 A1* | 7/2008 | Hudgens et al. ............. 414/288 |
| 2011/0222994 A1* | 9/2011 | Inagaki ............ H01L 21/67733 414/222.07 |
| 2011/0245964 A1 | 10/2011 | Sullivan et al. |
| 2012/0214396 A1* | 8/2012 | Flitsch .......................... 454/187 |
| 2013/0195584 A1* | 8/2013 | Furuichi ................... B25J 9/042 414/217 |
| 2013/0195598 A1* | 8/2013 | Furuichi ........... H01L 21/67742 414/744.3 |
| 2013/0195601 A1* | 8/2013 | Shin ........................ B25J 9/02 414/744.5 |
| 2013/0226329 A1* | 8/2013 | Flitsch ............... H01L 21/67727 700/112 |
| 2014/0180469 A1* | 6/2014 | Flitsch .......................... 700/218 |
| 2015/0227136 A1* | 8/2015 | Flitsch ................ G05B 19/418 700/121 |
| 2015/0266675 A1* | 9/2015 | Flitsch ................ H01L 21/6719 414/222.13 |
| 2015/0301524 A1* | 10/2015 | Flitsch ............... G05B 19/4189 700/112 |
| 2016/0132045 A1* | 5/2016 | Flitsch ............... G05B 19/4189 700/112 |

* cited by examiner

METHOD AND APPARATUS TO SUPPORT PROCESS TOOL MODULES IN A CLEANSPACE FABRICATOR

CROSS REFERENCE TO RELATED APPLICATIONS

This application claims priority to U.S. Provisional Patent Application Ser. No. 61/146,183, filed Jan. 21, 2009. This application is also a continuation-in part to the U.S. patent application bearing the Ser. No. 11/156,205, filed Jun. 18, 2005 and entitled "Method and Apparatus for a Cleanspace Fabricator" and to any divisional or continuation patents thereto. The contents of each are relied upon and incorporated by reference.

FIELD OF THE INVENTION

The present invention relates to apparatus and methods which support processing tools in used in conjunction with cleanspace fabricators. More specifically, the present invention relates to fabricator processing tools with one or more component assemblies routinely replaceable and located at least partially within a cleanspace based fabricator.

BACKGROUND OF THE INVENTION

A known approach to advanced technology fabrication of materials such as semiconductor substrates, is to assemble a manufacturing facility as a "cleanroom." In such cleanrooms, processing tools are arranged to provide aisle space for human operators or automation equipment. Exemplary cleanroom design is described in: "Cleanroom Design, Second Edition," edited by W. Whyte, published by John Wiley & Sons, 1999, ISBN 0-471-94204-9, (herein after referred to as "the Whyte text").

Cleanroom design has evolved over time to include locating processing stations within clean hoods. Vertical unidirectional airflow can be directed through a raised floor, with separate cores for the tools and aisles. It is also known to have specialized mini-environments which surround only a processing tool for added space cleanliness. Another known approach includes the "ballroom" approach, wherein tools, operators and automation all reside in the same cleanroom.

Evolutionary improvements have enabled higher yields and the production of devices with smaller geometries. However, known cleanroom design has disadvantages and limitations.

For example, as the size of tools has increased and the dimensions of cleanrooms have increased, the volume of cleanspace that is controlled has concomitantly increased. As a result, the cost of building the cleanspace, and the cost of maintaining the cleanliness of such cleanspace, has increased considerably.

Tool installation in a cleanroom can be difficult. The initial "fit up" of a "fab" with tools, when the floor space is relatively empty, can be relatively straightforward. However, as tools are put in place and a fabricator begins to process substrates, it can become increasingly difficult and disruptive of job flow, to either place new tools or remove old ones. Likewise it has been difficult to remove a subassembly or component that makes up a fabricator tool in order to perform maintenance or replace such a subassembly or component of the fabricator tool. It would be desirable therefore to reduce installation difficulties attendant to dense tool placement while still maintaining such density, since denser tool placement otherwise affords substantial economic advantages relating to cleanroom construction and maintenance.

It would be desirable to have manufacturing facilities for clean environment fabrication that facilitate sufficient access to components which make up fabricator tools for replacement or maintenance of the components. The prior art defines novel designs of the clean environments, called cleanspaces which address these needs.

SUMMARY OF THE INVENTION

Accordingly, building on the types of environments defined in previous patents, there are a subset of cleanspace fabricators where the process tooling is large, as would be the case for tools that process 8 inch and larger substrates, the reversibly removable aspect of tooling is less relevant than for fabricators where the tooling is significantly smaller. Nevertheless, even for the large tool design the general aspects of novel cleanspace designs apply. The fact that all the processing tools reside on a peripheral location of a clean space makes it possible to access the processing tool in flexible and easy manners. Accordingly, the present invention provides description of how the previously discussed strategies can be taken one step further where reversibly removable items in the fabricator environment include portions of a processing tool. The processing tool can be placed with each port inside the first cleanspace and the body of each processing tool can be placed at a location peripheral to the cleanspace boundary wall, such that at least a portion of the tool body is outside the cleanspace. Furthermore, within the body of the processing tool can be additionally defined subsections which can be removed from an outside access in a straightforward manner. Therefore, the portion of the processing tool that defines the processing environment, for example, could be made to be an easily removable and replaceable part.

It is logically possible for the concept of significant tool component assemblies being routinely replaceable to also cover the needs of fabricators where the tooling is small and supports smaller substrates. In such cases, the component assembly could be a small entity but nevertheless define a subset of the removable tooling unit as well. There may be operational advantages under certain circumstances for replacing just the component assembly and not the entire tool.

The present invention can therefore include methods and apparatus for: supporting the components of processing tools, supplying utilities to the individual components of processing tools, transporting materials from the tool body into the individual component of the processing tool and placing components of a processing tool into and out of physical communication with the cleanspace.

One general aspect includes apparatus for positioning a component assembly portion of a processing tool on the perimeter of a cleanspace, the apparatus including: a chassis supporting a base plate for mounting a component assembly onto, said chassis including an extended position and an operating position, where the operating position places a port including the processing tool mounted to said base plate in physical proximity to a clean space and the extended position places a component including the processing tool mounted to said base plate on the periphery of the cleanspace; and where said base plate includes a mating surface for receiving the tool component Implementations may include one or more of the following features. The apparatus where the mating surface includes tabs protruding from the surface, where the tabs are functional for aligning the tool component received thereon. The apparatus where the tabs are additionally operative for providing electrical connection for one or more of: electrical power and data signal to terminals including the tool component. The apparatus additionally including a flange portion operative to connect utility service conduits to the tool component, said utility services including one or more of: chemical gas supply; liquid supply; electric power supply; and data signal connection. The apparatus where the flange includes multiple primary sealing surfaces, each primary sealing surface for supply of a discrete utility service. The apparatus where the flange additionally includes one or more secondary sealing surfaces operative to seal a gas or liquid leaking from a primary seal from entering an ambient atmosphere. The apparatus where the flange additionally includes a circular rubber seal around a perimeter of said flange and operative to maintain liquid and gaseous separation between and interior of said flange and an exterior of said flange. The apparatus where the flange additionally includes a channel for maintaining a negative atmospheric pressure around a seal containing a gas, said negative atmospheric pressure operative to evacuate any gas leaking from the seal to an area external to the cleanspace. The apparatus additionally including a rail on which the base plate can slide from the extended position to the operating position. The apparatus additionally including a motor linked to the base plate for sliding the base plate from the extended position to the operating position. The method of using the apparatus in the production of substrates Implementations may include one or more of the following features. The flange additionally including: a contiguous channel circumventing an aggregate the primary connection points, a channel seal atmospherically sealing an interior area defined by the contiguous channel, a fixture for connecting a source negative atmospheric pressure to the channel, and at least one electronic sensor operative to monitor one or more gases leaking from the primary connection points. The flange additionally including: a contiguous channel circumventing the aggregate connection points, a channel seal atmospherically sealing an interior area defined by the contiguous channel, a fixture for connecting a fluid drain to the channel, and electronic sensors operative to monitor one or more fluids leaking from the multiple sealing surfaces. The method of using the apparatus in the production of substrates. The support additionally including apparatus operative to physically remove and install the component into a processing tool. The apparatus where the apparatus is installed into a processing tool body including a cleanspace fabricator. The method of using the apparatus in the production of substrates.

One general aspect includes a flange for connecting a fabrication tool component mounted to a base plate on a movable chassis to a tool body in a fabrication clean space, the flange including: a first sealing surface connected to multiple conduits, with a primary connection point for each conduit formed in the first sealing surface; a second sealing surface with multiple secondary connection points each secondary connection point positioned to interface with a respective primary connection point; a seal attached to one or more primary connection point, where said attachment of the seal isolates an interior defined by the seal from an exterior defined by the seal; one or more areas formed about each secondary connection point for receiving each respective seal when the first sealing surface is brought proximate to the second sealing surface; and a fastener for holding the first sealing surface proximate to the second sealing surface. Implementations may include one or more of the following features. The flange additionally including: a contiguous channel circumventing an aggregate the primary connection points, a channel seal atmospherically sealing an interior area defined by the contiguous channel, a fixture for connecting a source negative atmospheric pressure to the channel, and at least one electronic sensor operative to monitor one or more gases leaking from the primary connection points. The flange additionally including: a contiguous channel circumventing the aggregate connection points, a channel seal atmospherically sealing an interior area defined by the contiguous channel, a fixture for connecting a fluid drain to the channel, and electronic sensors operative to monitor one or more fluids leaking from the multiple sealing surfaces. The method of using the apparatus in the production of substrates. The support additionally including apparatus operative to physically remove and install the component into a processing tool. The apparatus where the apparatus is installed into a processing tool body including a cleanspace fabricator. The method of using the apparatus in the production of substrates.

One general aspect includes a support for mounting a tool component module on the periphery of a cleanspace and capable of removing said component without disturbing the integrity of the cleanspace, said support including mechanisms for specific location of the component, mechanisms for connection and disconnection of one or more of: electrical power; data transmission; a gas, a liquid; a powder; and negative atmospheric pressure. Implementations may include one or more of the following features. The support additionally including apparatus operative to physically remove and install the component into a processing tool. The apparatus where the apparatus is installed into a processing tool body including a cleanspace fabricator. The method of using the apparatus in the production of substrates.

One general aspect includes a method of processing a semiconductor substrate, the method including the steps of: positioning a component assembly portion of a processing tool on the perimeter of a cleanspace, where the component assembly is mounted to a chassis supporting a base plate, said chassis including an extended position and an operating position, where the operating position places a port including the processing tool mounted to said base plate in physical proximity to a clean space and the extended position places a component including the processing tool mounted to said base plate on the periphery of the cleanspace; and where said base plate includes a mating surface for receiving the tool component; and transferring a substrate to the processing tool.

BRIEF DESCRIPTION OF THE DRAWINGS

The accompanying drawings, that are incorporated in and constitute a part of this specification, illustrate several embodiments of the invention and, together with the description, serve to explain the principles of the invention.

DETAILED DESCRIPTION OF PREFERRED EMBODIMENTS

The present invention relates to methods and apparatus to support a cleanspace environment within which a material, such as an integrated circuit substrate, can be processed. The support can include methods and apparatus which allow a portion of a tool used to process the material to be accessible from within a cleanspace in which the material is processed. An additional portion of the processing tool can remain outside of the cleanspace environment in which a material is processed. In addition, the present invention provides for methods and apparatus to facilitate installation, removal and maintenance of processing tools used to process the material.

Traditionally, when installing a processing tool into a cleanspace, such as a semiconductor fabricator, riggers had to place the processing tool in a designated position where the processing tool remained in place for its entire time in the fabricator. Repair of the processing tool, or replacement of a sub-assembly of the processing tool took place within the confine of the cleanspace and thereby often affected the integrity of the cleanspace and made it difficult for the technicians having to work with appropriate cleanspace protective clothing. The present invention provides for an alternative strategy wherein processing tools can be routinely placed and removed from a fabricator location. In addition, ease of access to a processing tool can facilitate one or both of placement and replacement of sub-assemblies of the processing tools form without the cleanspace perimeter and with minimal impact on the integrity of the cleanspace.

According to the present invention, routine placement and removability of processing tools in a fabricator is made possible by locating the fabricator processing tools on the periphery of the clean space environment. Generally, a port portion of the processing tool extends into the cleanspace while a body portion of the processing tool remains on an exterior periphery to the cleanspace. The location of the processing tool facilitates access to sub-assemblies of processing tools for removal and placement of a subassembly of the processing tool while still maintaining the integrity of the cleanspace. Components or subassemblies of process tooling are designed in a modular fashion such that a component or subassembly can been replaced in these cleanspace environments in an analogous fashion to the placement and replacement of entire tool bodies.

Following, reference will be made in detail to different aspects of some preferred embodiments of the invention, examples of which are illustrated in the accompanying drawings. Wherever possible, the same reference numbers will be used throughout the drawings to refer to the same or like parts. A Glossary of Selected Terms is included at the end of this Detailed Description.

Figure 1:
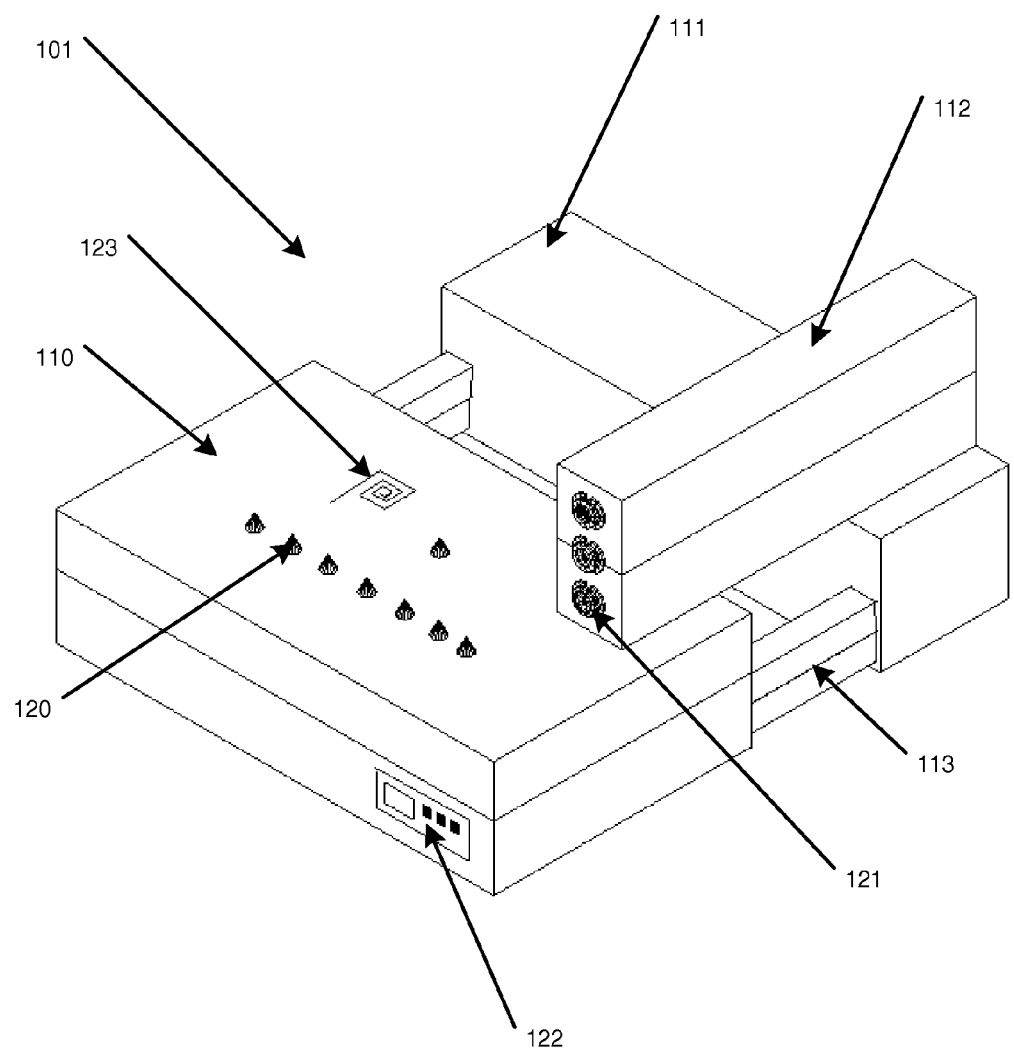
FIG. 1 Illustrates an example of Chassis Embodiment

Referring now to FIG. 1, a chassis 101 is illustrated according to some embodiments of the present invention. Base plates are attached to a sliding rail system 113 provide an installation location for a processing tool body (not illustrated). Base plate 111 is physically fixed in an appropriate location of a fabricator. In some embodiments, base plate 111 would not interact directly with the tool body, however, in some embodiments, a tool body can be fixedly attached to the base plate 111. In both embodiments, chassis plate 110 can physically support a tool body mounted on the chassis 101.

A tool body may be mounted so that a portion, or the entirety of the tool is contained within the cleanspace. In some embodiments, a portion contained within the cleanspace may be as small as a port for receiving a substrate or other material to be processed by the processing machine In FIG. 1, the orientation of two plates is shown with the plates separated. The chassis 101 can have multiple service location orientations. A first location, as shown in the drawing, can involve an extended location, such that the placement and removal of a tool body from the chassis plate 110 can occur in an exposed location. An exposed location, for example, can facilitate placement of a new tool onto the chassis plate 110. A second service location allows the chassis 101 to relocate such that both chassis plates 110 and base plate 111 are close together. An illustration of an exemplary second service location is provided in FIG. 5 including plates 510 and 511.

In some embodiments, tabs 120 may stick out of the top of the chassis plate 110. The tabs 120 may serve one or more purposes. As a physical extension, the tabs 120 will have a corresponding indentation (not illustrated) in the mating plate or a surface of a tool body 201 to be placed on the tabs 120. As the tool body 201 is lowered over the chassis plate 110, the tool body 201 will reach a location as defined by tabs 120. In some embodiments, the tabs 120 can additionally provide electrical connection between the chassis plate 110 and the tool body 201. Electrical connection can serve one or more of the purposes of: electrical power and electrical data signal.

In some embodiments, a wireless interface 123 can provide wireless electrical connection between the tool body and the chassis. The wireless interface 123 can be redundant to hardwire data connections or take the place of hardwire data connection. The wireless interface can also be utilized for other electrical connections, as discussed for tabs 120. In some embodiments, a wireless interface 123 can provide one or both of electrical power and data communication.

Connections for non-electrical utilities 121 can also be provided, as discussed more fully below in the section entitled Utility Flange Connectors. Connections for non-electrical utilities 121 can be used for defining a connection, for example, of one or more of: gas, vacuum, fluids waste lines, compresses air, deionized water, chemicals and the like. Various conduits 112 can carry these utilities to the connections for non-electrical utilities 121 and be routed, for example, through the chassis 101. The conduits 112 can be connected to appropriate facility supply systems, airflow systems and drains to provide for safe operation.

In general a cleanspace may be classified according to standards set for cleanrooms. However, those skilled in the art will recognize according to the preceding description, that a cleanspace is not limited to the confines of a "room". Cleanspaces may be circular, rectangular, square, of a generally peripheral nature with a core portion dedicated to utilities or other configuration. Other shapes can include an arc or curved wall design. The cleanspace may be a single "story" high or multiple "stories" wherein a story is defined by a vertical placement of a processing machine. Similarly, processing machines may be relatively small, such as for a four inch wafer, or even smaller, such as, for example, a one or two inch wafer; or processing machines for larger wafers, such as, for example an eight inch wafer or sixteen inch wafer.

Classifications can be based, for example, according to the number and size of particles permitted per volume of air. Large numbers like "class 100" or "class 1000" refer to US FED STD 209E, and denote the number of particles of size 0.5 .mu.m or larger permitted per cubic foot of air. The standard also allows interpolation, so it is possible to describe e.g. "class 2000".

Small numbers can refer to ISO 14644-1 standards, which specify the decimal logarithm of the number of particles 0.1 .mu.m or larger permitted per cubic meter of air. So, for example, an ISO class 5 clean room has at most $10^5 = 100,000$ particles per $m^3$.

For example, a cleanspace meeting a US FED STD 209E cleanroom standard can include:

| | Particles/ft$^3$ | | | | |
|---|---|---|---|---|---|
| Class | 0.1 μm | 0.2 μm | 0.3 μm | 0.5 μm | 5 μm |
| 1 | 35 | 7 | 3 | 1 | |
| 10 | 350 | 75 | 30 | 10 | |
| 100 | | 750 | 300 | 100 | |
| 1,000 | | | | 1,000 | 7 |
| 10,000 | | | | 10,000 | 70 |
| 100,000 | | | | 100,000 | 700 |

In addition, a cleanspace according to ISO 14644-1 cleanroom standards can include a space clean according to the following standards:

| | particles/m$^3$ | | | | | |
|---|---|---|---|---|---|---|
| Class | 0.1 μm | 0.2 μm | 0.3 μm | 0.5 μm | 1 μm | 5 μm |
| ISO 1 | 10 | 2 | | | | |
| ISO 2 | 100 | 24 | 10 | 4 | | |
| ISO 3 | 1,000 | 237 | 102 | 35 | 8 | |
| ISO 4 | 10,000 | 2,370 | 1,020 | 352 | 83 | |
| ISO 5 | 100,000 | 23,700 | 10,200 | 3,520 | 832 | 29 |
| ISO 6 | 1,000,000 | 237,000 | 102,000 | 35,200 | 8,320 | 293 |
| ISO 7 | | | | 352,000 | 83,200 | 2,930 |
| ISO 8 | | | | 3,520,000 | 832,000 | 29,300 |
| ISO 9 | | | | 35,200,000 | 8,320,000 | 293,000 |

As applied to a cleanspace, the following classes are generally equivalent, although the testing standards for each may differ:

| | particles/m$^3$ | | |
|---|---|---|---|
| Class | 0.5 μm | 5 μm | 10 μm |
| Class 1 | 3,000 | 0 | |
| Class 2 | 300,000 | 3,000 | 30 |

Figure 2:
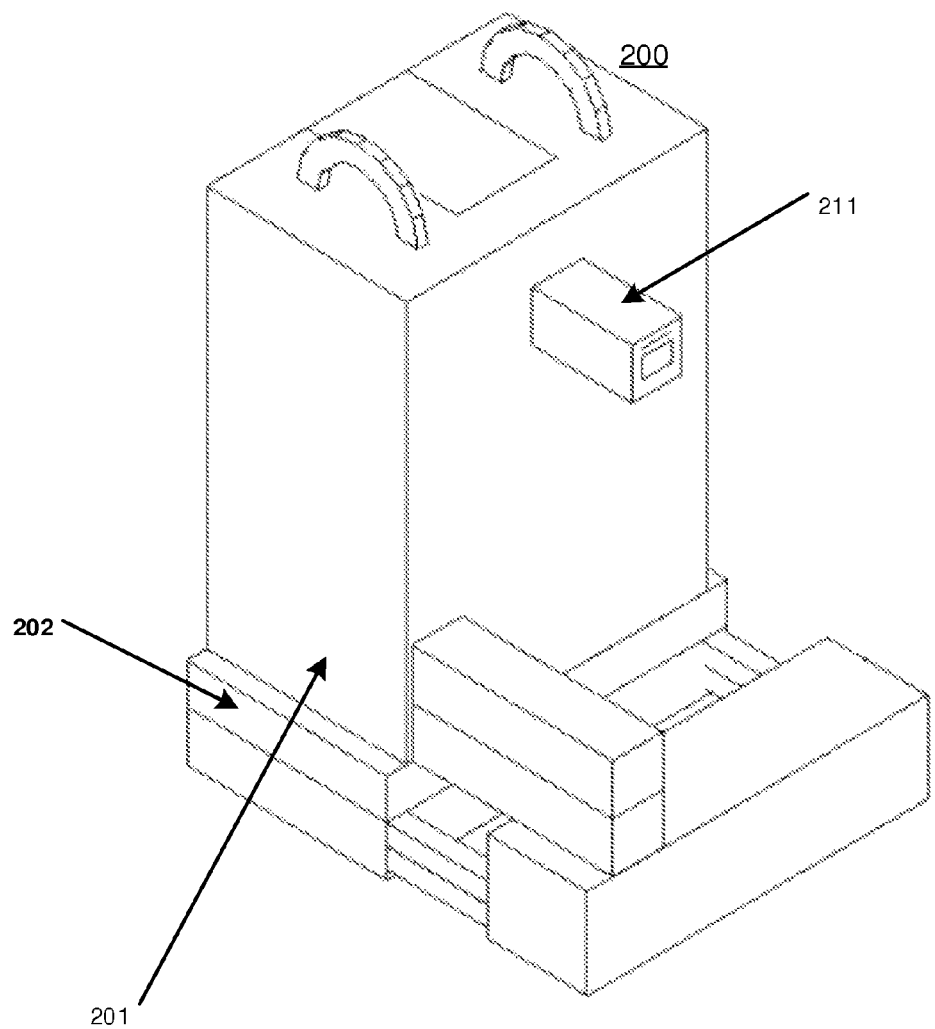
FIG. 2 Illustrates an example of a Front View with Tool Body Placed

Referring now to FIG. 2, a tool body 201 can be placed onto the chassis plate 110. The tool body 201 is illustrated in a generic box, however, any type of processing tool, such as those required for semiconductor manufacture, is within the scope of the invention. In some embodiments, the underside of a tool body 201 can include a mating plate which physically interfaces with a chassis top plate 202.

The present invention includes apparatus to facilitate placement of processing tool bodies in a fab and the methods for using such placement. The chassis 101 design can be capable of assuming two defined positions; one extended position places an interface plate external to the environment that the tool assumes when it is processing. This allows for easy placement and removal. The other position can be the location where the tooling sits when it is capable of processing. The exact placement of the tooling afforded by the chassis 101 allows for more rational interconnection to facilities and utilities and also for the interfacing of the tool body 201 with fab automation. The chassis 101 can have automated operations capabilities that interfaces with the tool body and the fab operation to ensure safe controlled operation.

In another aspect of the invention, a processing tool 200 can transfer a material, such as, for example, a semiconductor substrate, in and out of a tool body 201. In FIG. 2, a tool port 211 can be used for coordinating transfer of a material into and out of the tool port 211 and maintaining cleanspace integrity of a tool body 201 interior. As can be seen in FIG. 2 this embodiment contemplates placing the tool port 211 in a manner physically connected to the tool body 201. A further purpose of the movement of the chassis plate 110 from its extended position to its closed position would be the movement of the tool port 211 through an opening in a clean space wall. This would allow the tool port 211 to occupy a position in a clean space so that fabricator logistics equipment can hand off wafers and carriers of wafers to the tool port 211.

Figure 3:
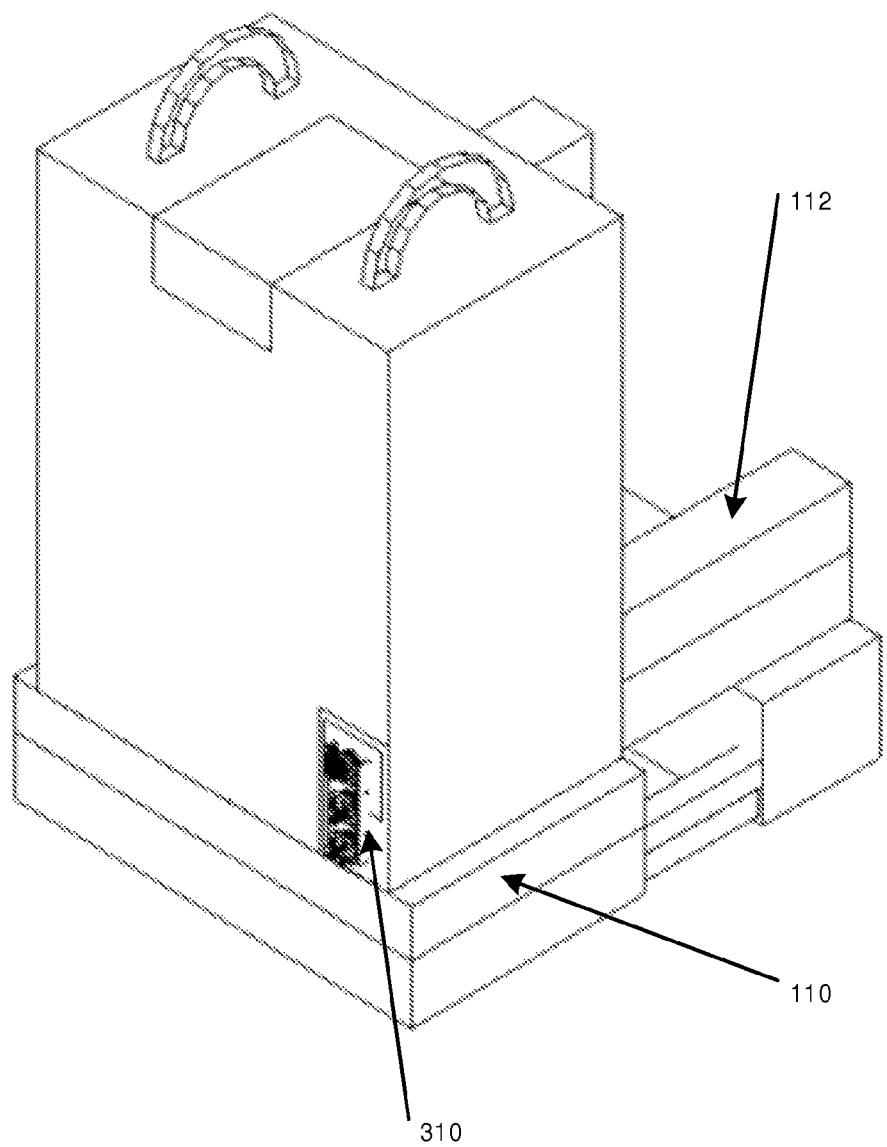
FIG. 3 Illustrates an example of a Rear View with Tool Body Placed
Figure 5:
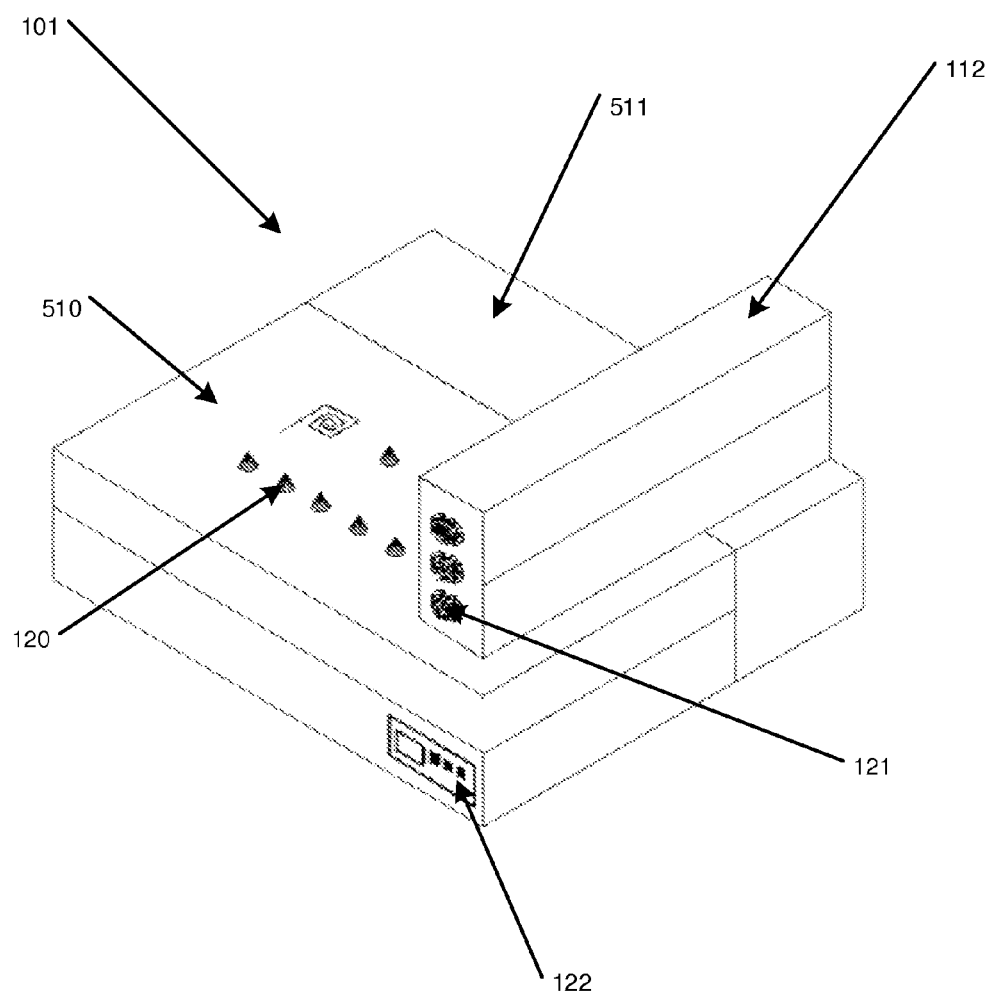
FIG. 5 Illustrates an example of Overview of Chassis—Not Extended

Referring now to FIG. 3, in some embodiments, a tool body 201 can include a specifically located set of tool connections 310 for connecting the tool body 201 to facility supplied utilities. When the tool and chassis are moved from an extended position as shown in FIG. 1 to a closed position as shown in FIG. 5, such movement can place tool connections 310 in proximity to the connections for non-electrical utilities 121 and thereby allow for connection of various utilities. In some embodiments, as a processing tool 200 is connected, various aspects of tool automation electronics can monitor the connection and determine when the connections are in a safe operating mode. Such tool automation electronics can communicate to the tool body 201 and to the chassis 101 to identify a state that the connections and supply conduits are in.

In still another aspect of the invention, in some embodiments, control automation can be contained within the chassis for various aspects of the operation of the chassis 101. It is within the scope of the present invention to monitor and control multiple states related to the chassis 101 via electronic included in the chassis 101. Such states can include, by way of example, a physical location of a chassis 101 in an extended or closed state. Therefore, for example, if a processing tool 200 and chassis 101 are in a closed and operational state, a technical operator issues a command to the chassis 101 to move to an extended location. Such communication could occur through a control panel 122 or through wireless communication to the chassis 101 through wireless interface 123. Control of the processing tools can be accomplished with any known machine controller technology, including for example a processor running executable software and generating a human readable interface.

In some embodiments, a command to move to the chassis 101 to an extended location can also initiate, amongst other algorithmic functions, a check for the status of utilities connections. It is also within the scope of this invention to require any such utility connections to be rendered into a state of disconnect before the chassis 101 can proceed to an extended position.

Similarly, in some embodiments, prior to operations such as extension of a chassis 101, processing steps can determine that a tool body 201 did not contain any substrates prior to extension of the chassis 101. It is also within the scope of the present invention for communication modes included within the chassis 101 to communicate with fab wide automation systems for purposes such as tracking the location of substrates; tracking the identity of tools; and tracking the status of processing tools. If connections to a processing tool 200 and chassis 101 are in a proper state then the chassis can move into an extended position allowing for removal of the tool body 201 and replacement with a similar tool body 201.

In some embodiments of the present invention, a fabricator will include automation to handle substrates and control their processing. And, in many cases the substrates can move from tool to tool in a specialized carrier which contains the substrates. The specialized carriers can be transported via automation which includes automated transport systems. The carriers can thereby be presented to one or more processing tool interfaces, also referred to herein as a "port". The automation allows for movement of the substrates around the fab and for loading and unloading the substrates from a processing tool. Substrates can include, for example and without limitation, wafers for semiconductor processing, microelectronic machines, nanotechnology, photonic, and biotechnological carriers.

A substrate processing tool port can support processing tools and handle wafers and wafer carriers in an environment attached to the tool body. The tool port can penetrate a clean space containment wall and the tool body can enable routine placement and replacement into the fabricator environment.

As described above, according to the present invention, processing tools reside with their tool bodies in a position which allows the tool body to be outside of a cleanspace with a tool port operatively attached to the tool body inside of the cleanspace. For example, embodiments can include a tool body adjacent to, or on the periphery of, a clean space of the fabricator and the tool port extending into the cleanspace. Each tool body can be removed and replaced in a standardized process and without requiring the removal of adjacent tool bodies. The present invention also anticipates the automated transfer of substrates from a first tool port of a first processing tool to a second tool port of a second processing tool, while maintaining the substrate in a clean space environment via a clean carrier.

Figure 4:
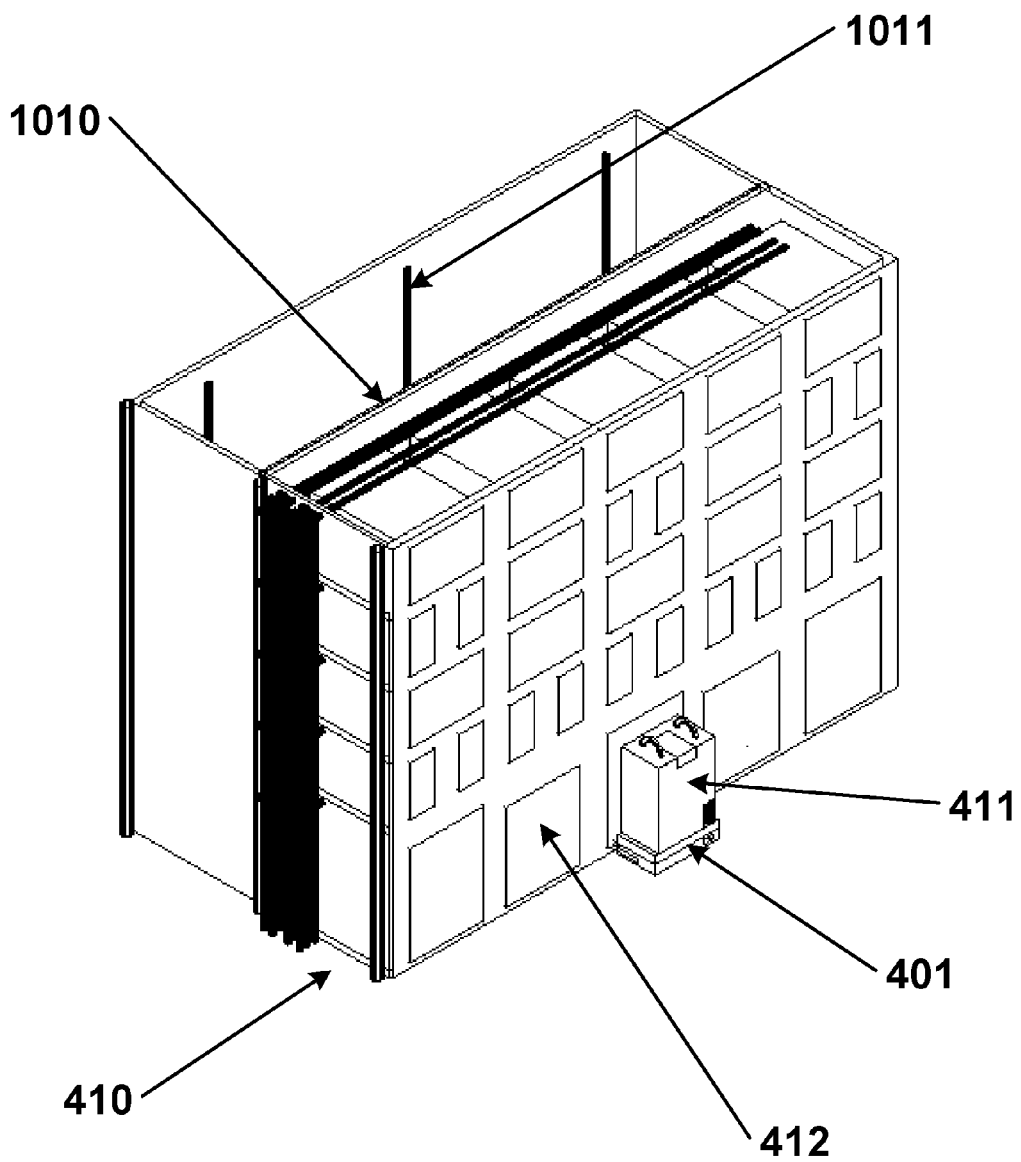
FIG. 4 Illustrates an example of Placement in an Example Fab Design

Referring now to FIG. 4, a fab 410 is illustrated with a tool body 411 extended in a position for access. The access may include, for example, installation, removal or service. The tool body 411 is mounted to a chassis 401. Another tool location 412 is illustrated in a closed position or in an operating position. Also shown are a clean room wall 1010 and a vertical rail system 1011.

As described above, according to the present invention, processing tools reside with their tool bodies in a position which allows the tool body 411 to be outside of a cleanspace with a tool port operatively attached to the tool body inside of the cleanspace. For example, embodiments can include a tool body 411 adjacent to, or on the periphery of, a cleanspace of the fabricator and the tool port extending into the cleanspace. Each tool body can be removed and replaced in a standardized process and without requiring the removal of adjacent tool bodies. The present invention also anticipates the automated transfer of substrates from a first tool port of a first processing tool to a second tool port of a second processing tool, while maintaining the substrate in a cleanspace environment via a clean carrier.

Embodiments therefore include tool ports that are capable of receiving a carrier from the automated transport system. Each carrier can contain at least one substrate. The automated transport unloads the carriers and passes the carrier off to the processing tools automation systems. In some embodiments, the port size enables it to span a wall used for the definition of a primary clean space of the fabricator. Inside the primary clean space resides the entry area of the tool port. The tool port's body can span a distance in excess of the width of the clean space wall to allow for substrates which are unloaded from their carrier to be robotically handed off to the tool body's automation.

The novel tool port can incorporate various levels of automated carrier and substrate handling apparatus. For example, in some embodiments, the carrier and handling apparatus can include communication systems which receive data from electronic sensors monitoring each port, processing tools and transport apparatus. In another aspect, a substrate can be contained within a controlled ambient environment while it is within the storage carrier, port and processing tool.

Substrate Handling

Figure 6:
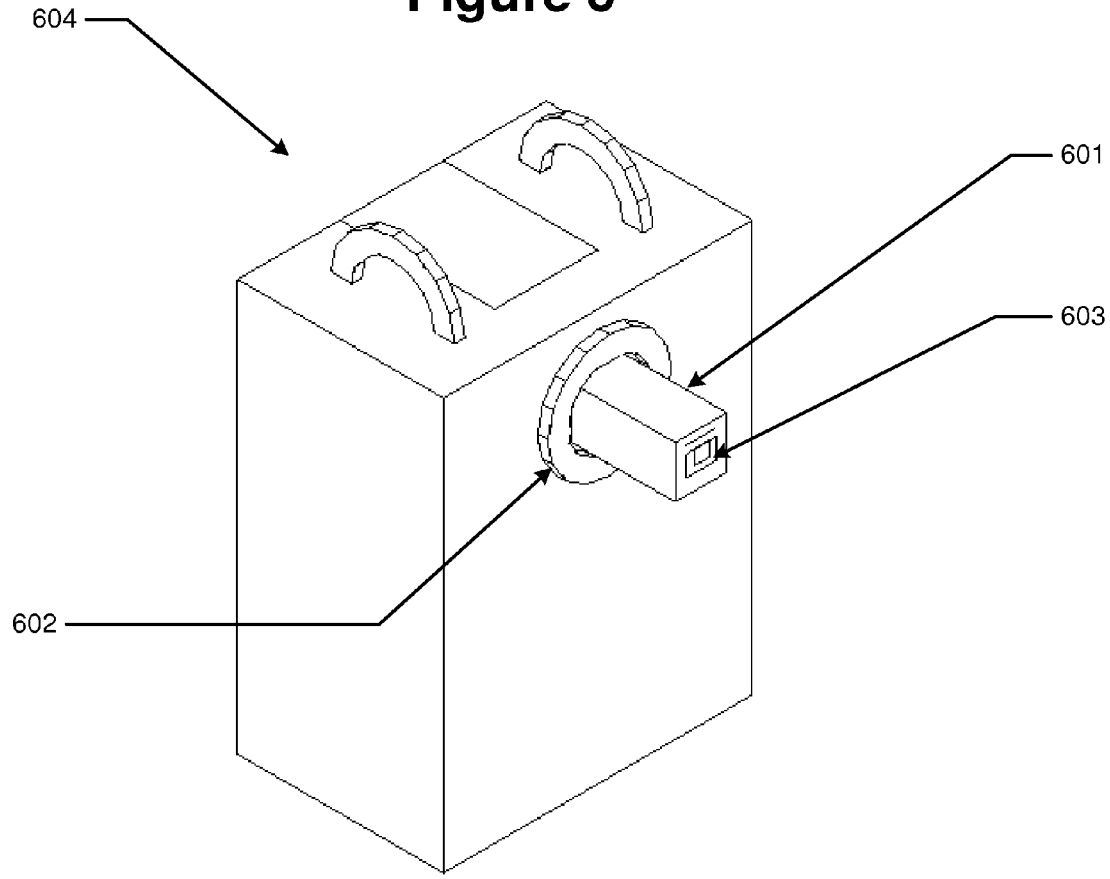
FIG. 6 Illustrates an example of the tool body elevation view showing a substrate handler.

Referring now to FIG. 6, the present invention provides methods and apparatus for handling substrate carriers in a way that is consistent with routine placement and replacement of the processing tool body 604. A processing tool body 604 is illustrated, in generic fashion, which contains processing equipment for processes commonly used in fabricating semiconductor devices. The processing tool body 604 is illustrated with handles to clearly indicate the ability of the processing tool body 604 to be removed from its processing position. The tool port 601 extends from the processing tool body 604. In some embodiments, the tool port 601 extends a sufficient distance to traverse an associated clean room wall and be in position for the port entry 603 or "mouth" to receive and hand off substrates.

In some embodiments, the processing tool body 604 resides in a secondary cleanspace which is independent of the primary cleanspace. Separation of the primary cleanspace and the secondary cleanspace is accomplished via a sealing mechanism 602. The sealing mechanism 602 can include, for example, a collapsible ring of material that when pushed against a sealing surface forms an atmospheric seal.

Figure 7:
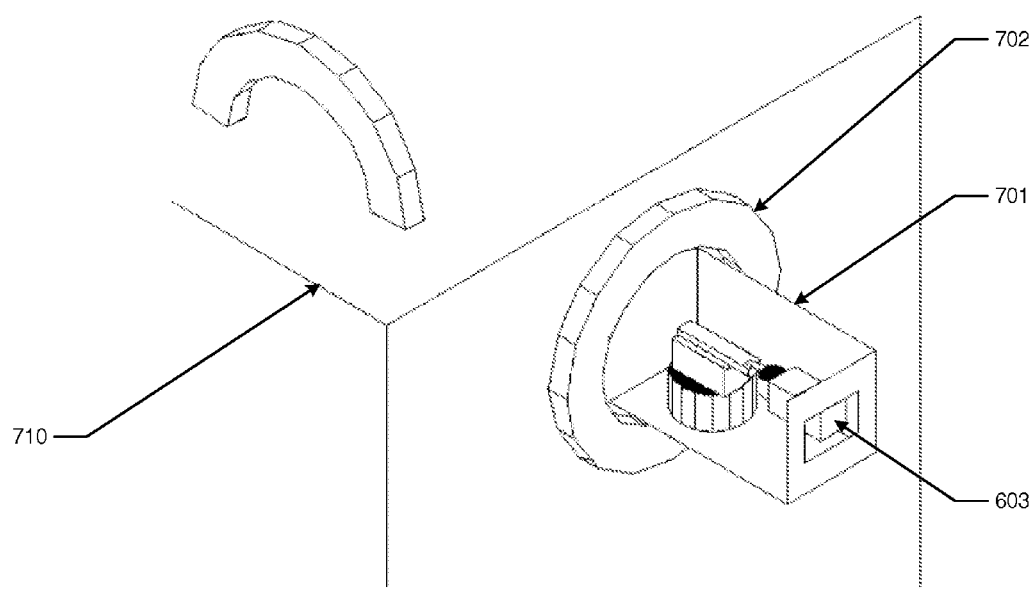
FIG. 7 Illustrates a close up view of substrate handler indicating internal components in context with a tool body.

Referring now to FIG. 7, closeup tool body 710 is shown at a closer perspective including the seal 702 around the tool port 701 and side panels around the inside removed.

Figure 8:
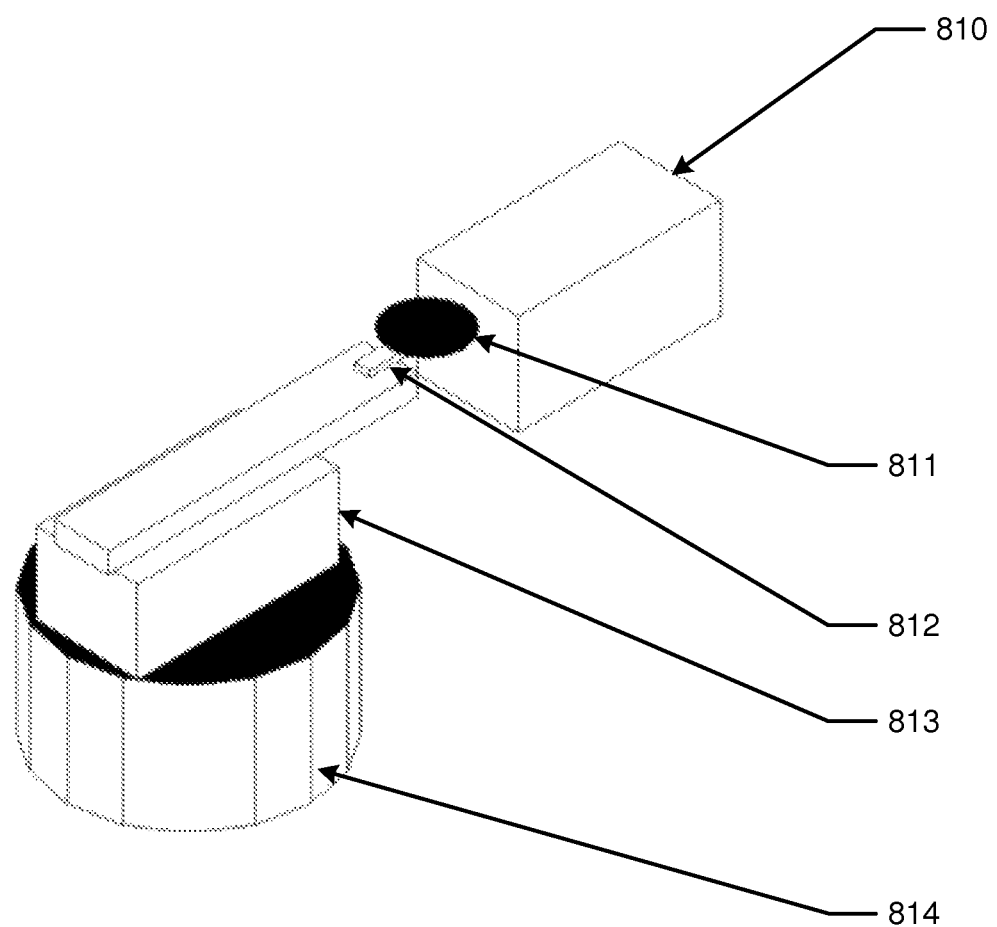
FIG. 8 Illustrates a Substrate Handler Internal Components.

FIG. 8 illustrates a close up of an embodiment of the internal components of a tool port 601. A cassette loading and unloading apparatus 810 is automatically operative to open a cassette (not shown) and insert or remove a substrate according to a software instruction received. A substrate 811 is illustrated being removed from the cassette loading and unloading apparatus 810. The substrate 811 is shown sitting on a holder 812, such as, for example, a vacuum actuated holder. The holder 812 is connected to a retractable handler arm 813. The retractable handler arm 813 can be operative to move the holder 812 and a substrate into and out of a cassette. A rotation platen 814 supports the retractable handler arm 813 and is capable of positioning the retractable handler arm 813 along an arcuate path.

In some exemplary embodiments, a cassette containing a substrate 811 is loaded by a fabricator automation robot into the "mouth" of a cassette loading and unloading apparatus 810. Inside the cassette loading and unloading apparatus 810, the cassette can be opened, thereby exposing a substrate 811 contained there. In some embodiments, the cassette maintains a cleanspace environment for the substrate 811 contained in the cassette. In addition, the environment of the unloading apparatus is also a cleanspace thereby keeping the substrate 811 in a cleanspace environment after it is unloaded.

The retractable handler arm 813 extends into the cassette and secures the substrate 811 with an actuated attachment mechanism, such as for example a vacuum tip. The retractable handler arm 813 is then retracted back out of the cassette unloader. In some embodiments, the retractable handler arm 813 centers over the rotation platen 814. A rotation of rotation platen 814 with the arm centered would lead to the minimum amount of space required. Once the arm has rotated towards the tool body, the arm can again extend allowing the wafer to be placed in a receiving location of the processing body 604. After processing, the substrate 811 can be moved back to a receiving location and picked up by the holder 812. By reversing the above steps the substrate 811 can be transferred back to a carrier for handoff to the fabricator automation. The fabricator automation can transport the substrate to an additional processing tool for further processing by the additional tool.

Figure 9:
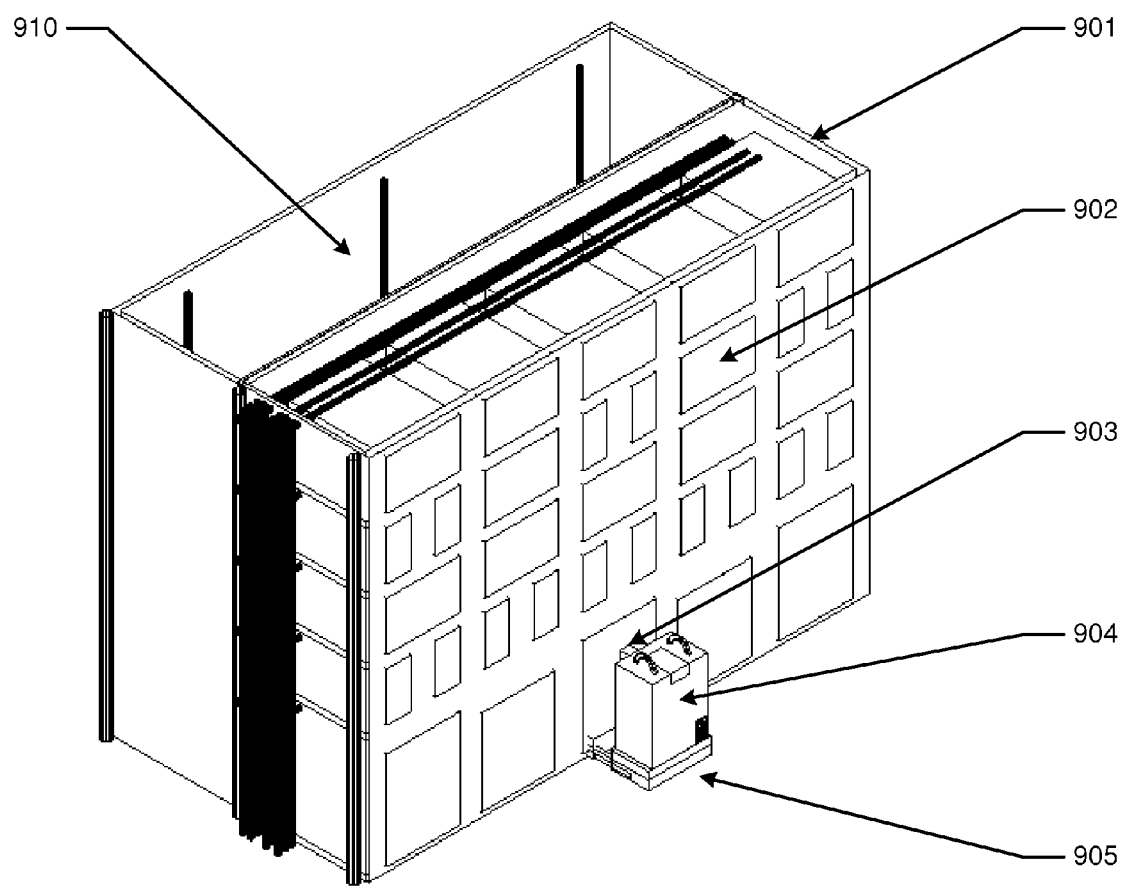
FIG. 9 Illustrates an example of a tool body with substrate handler attached to an exemplary fabricator.

FIG. 9 illustrates perspective view of how a port according to the present invention is operatively attached to a tool which is easily placed and replaced. In some embodiments, a fabricator 901 has a series of tools 902 which may stacked. When a tool is being placed or replaced it sits in a retracted position 905 relative to a normal position in a fabricator. The tool body, 904, is shown in its retracted position, 905. As illustrated, the tool port 903, is located on a side of the tool body 904 with the furthest edge just visible.

Figure 10:
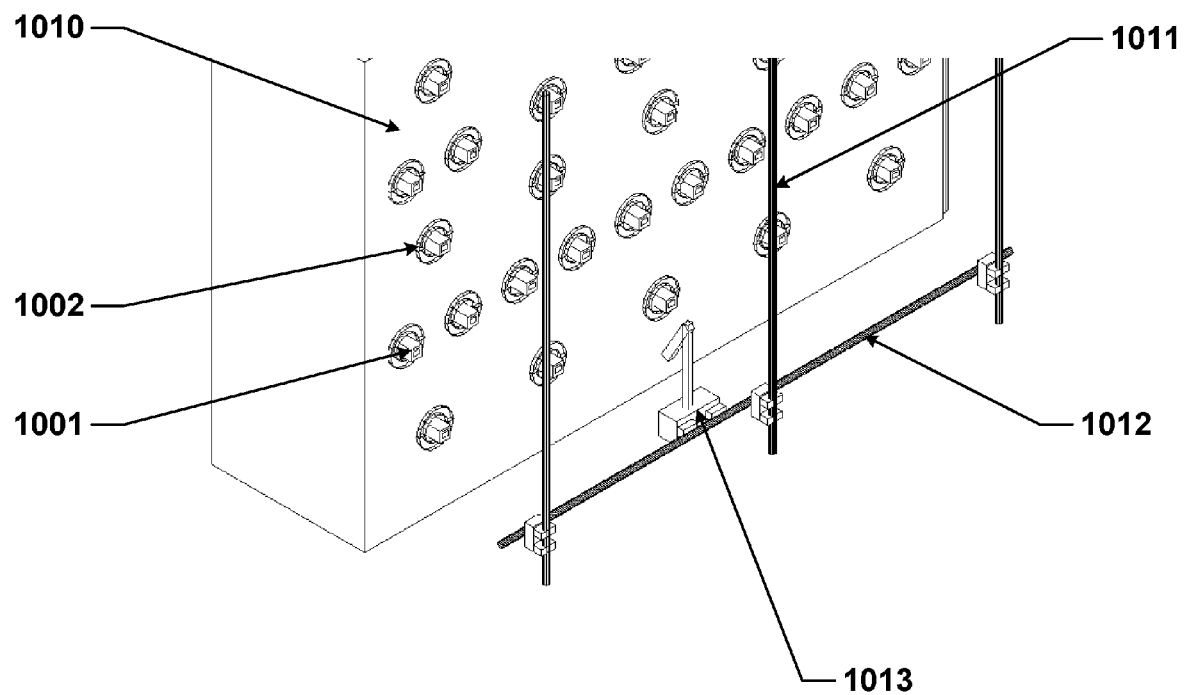
FIG. 10 Illustrates a rear view plane view of an exemplary fabricator with back walls removed and thereby showing multiple tool ports and fabricator automation.

FIG. 10 shows a perspective of the fabricator 901 from the opposite side of the primary cleanspace 910, illustrated in FIG. 9. The back fabricator walls have been cut away in order to illustrate an inner portion of the fabricator 901, including multiple tool ports, such as, for example as exemplified by tool port 1001. Tool port 1001 is attached to a tool body 904 that is fully advanced into the fabricator and in the normal position.

According to some embodiments, while a tool body is located in the normal position, a seal is formed against the sealing surface 1002 maintaining the integrity of the cleanspace into which the tool port 1001 extends. As illustrated, the tool body 904 connected to the tool port 1001 extends away from the clean room wall 1010. In this position, the tool port 1001 is able to interface with transport automation 1013 situated on a rail 1012. In some embodiments, a robot arm would index from the transport automation 1013 to a correct tool port 1001 position by moving horizontally on rail 1012 while that rail moved along the vertical rail system 1011. Any other known transport automation can similarly be employed to position the tool port 1001. When transport automation 1013 is located in a programmed position, the rail 1012 moves forward to hand a wafer cassette to the tool port 1001.

In another aspect, the cleanliness of the clean environment of fabricator 901 and each individual port can be facilitated by transporting equipment on the rail 1012 to a tool port 1001 and open the tool port 1001 to flow liquids or gasses over the internal surfaces of the tool port 1001 in order to facilitate particulate and film cleaning.

Some embodiments of the present invention which relate to the specific application of semiconductor fabrication have been described in order to better demonstrate various useful aspects of the invention. However, such exemplary descriptions are not meant to limit the application of the inventive concepts described herein in any way. Embodiments may therefore include, for example, applications in research and generation of: pharmaceutical products, nanostructure products and other applications which benefit from the availability of cleanspace and multiple processing tools.

Figure 11:
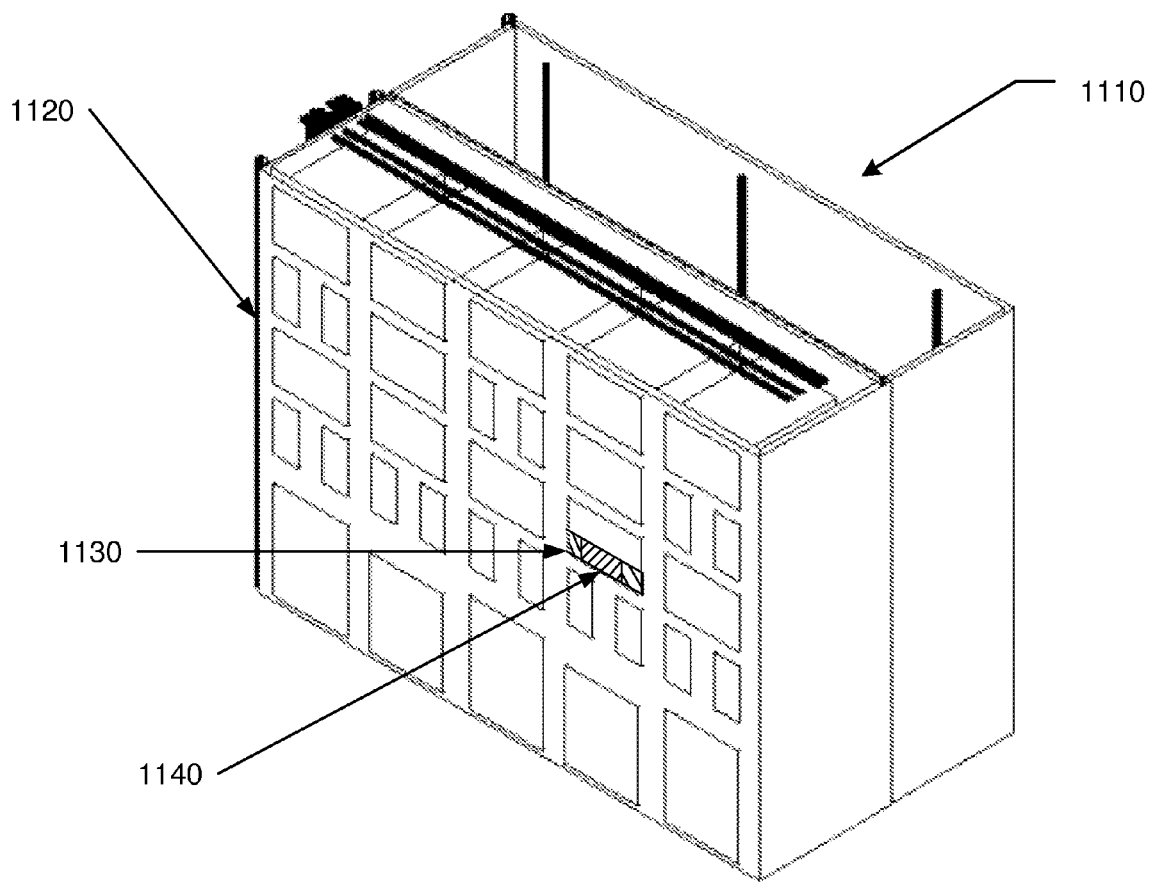
FIG. 11 Illustrates an example of an overview of a cleanspace environment with a reversibly removable component assembly demonstrated in the installed configuration.
Figure 12:
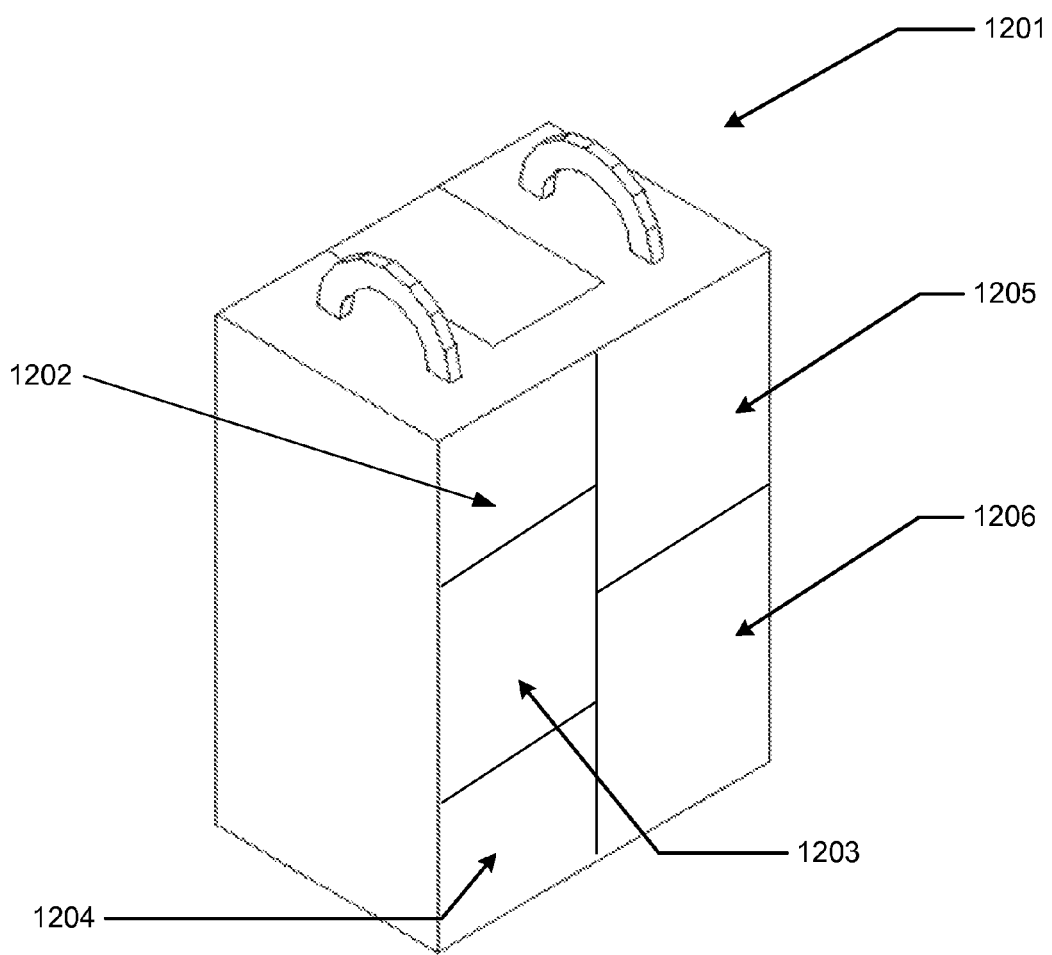
FIG. 12 Illustrates an example of multiple component assemblies of a processing tool.

Referring now to FIG. 11, a cleanspace based fabricator 1110 according to some embodiments of the present invention is depicted. One side of the clean-space illustrates a peripheral location 1120 from which component assemblies are accessible. A first component assembly 1130 and a second component assembly 1140 are located in a cleanspace based fabricator 1110 and accessible from a peripheral location 1120 of the cleanspace based fabricator 1110. Each tool is made up of multiple component assemblies such as first component assembly 1130 and second component assembly 1140 (as illustrated in FIG. 12). Second component assembly 1140, is shown in an installed orientation in the processing environment.

Referring now to FIG. 12, a tool 1201 is illustrated with multiple component assemblies 1202-1206. Each component assembly includes some subset or sub-assembly of the tool 1201. A component assembly can include, for example: a reaction chamber of a CVD reactor; the metal deposition chamber of a metal deposition tool; a chemical tank of a wet chemical processing tool; and the ion source of an ion implant tool for example. According to some embodiments of the present invention, component assemblies 1202-1206 are accessible individually, in a similar fashion to accessing entire processing tools which can be accessible, from the periphery of a cleanspace.

Figure 13:
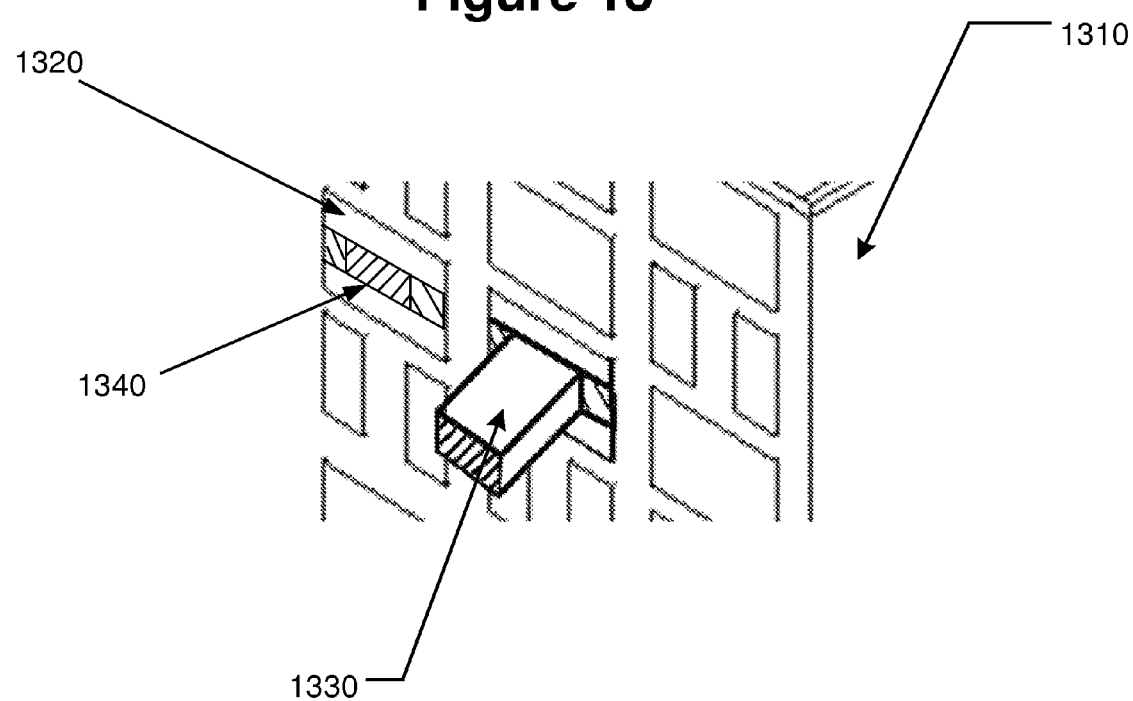
FIG. 13 Illustrates an example of a close up view of a processing tool with a component assembly in a position of being removed or replaced.

Referring now to FIG. 13, a magnified section; 1310, of an exemplary fabricator according to some embodiments of the present invention is depicted. A component assembly 1330 is depicted in a non-installed position. A second tool 1320 may have an exact replica 1340 of the component assembly 1330, only the second tool 1320 is illustrated with the exact replica 1340 in an installed position, wherein a portion of the second tool 1320 is able to operate in communication with a cleanspace portion of the fab.

According to the present invention, a component assembly 1330 may be accessed and replaced from the periphery of the cleanspace portion of the fab. Multiple purposes may be furthered by accessing a component assembly 1330 from the periphery of the fab. For example: a component assembly 1330 may have reached a lifetime for preventive maintenance; it may be malfunctioning; or it may have an engineering design change implemented to improve its function. Those schooled in the art will recognize that numerous other reasons may be served from the removal of a component assembly 1330 from a cleanspace environment into a location from which component assemblies may be accessed.

The issues that need to be dealt with for a component assembly replacement are generally similar in nature and solution as the issues related to reversibly removable tooling. The connection of the component assemblies to utilities or other support mechanisms such as, for example: electrical power, gasses, wafer handling or other support mechanisms can have similar requirements and solutions.

Figure 14:
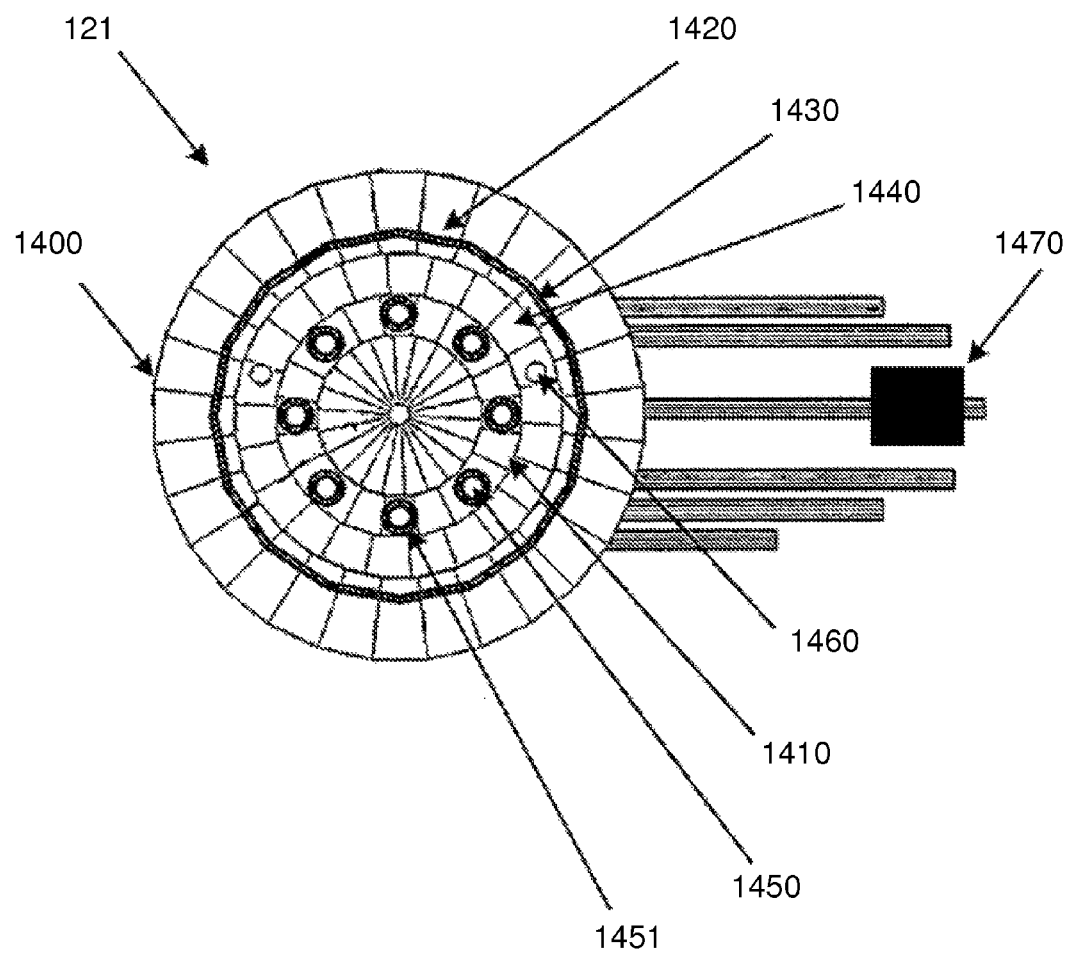
FIG. 14 Illustrates an example of the close up illustration of the device for connections for non-electrical utilities of FIG. 1 that may be used for connecting a component assembly according to some examples of the present disclosure.

Referring to FIG. 14, a close up view of a flange 1400 which is a magnified illustration of the connections for non-electrical utilities 121 is presented. The flange 1400 may have multiple primary sealing surfaces 1410 as illustrated for the surface regions around each of the illustrated multiple primary connection points 1450. In some examples, where the flange 1400 is a first flange of a flange set, these surface regions may be referred to as a first sealing surface or a first primary sealing surface and the attachment of "first" as an identifying prefix to each of the elements of the flange 1400 may also be made. There may be a secondary sealing surface 1420 and in some examples there may be more than one secondary sealing surface 1420. In some examples there may be a circular rubber seal 1430. In some examples, there may be a channel 1440 that may also interface with a fixture 1460 for connecting a fluid drain to the channel 1440. In some examples, there may be a respective seal 1451 for each of the primary connection points 1450. In some examples there may be an electronic sensor 1470 that may be operative to monitor one or more fluids leaking from the first sealing surface or a second sealing surface as mentioned below.

Figure 15A:
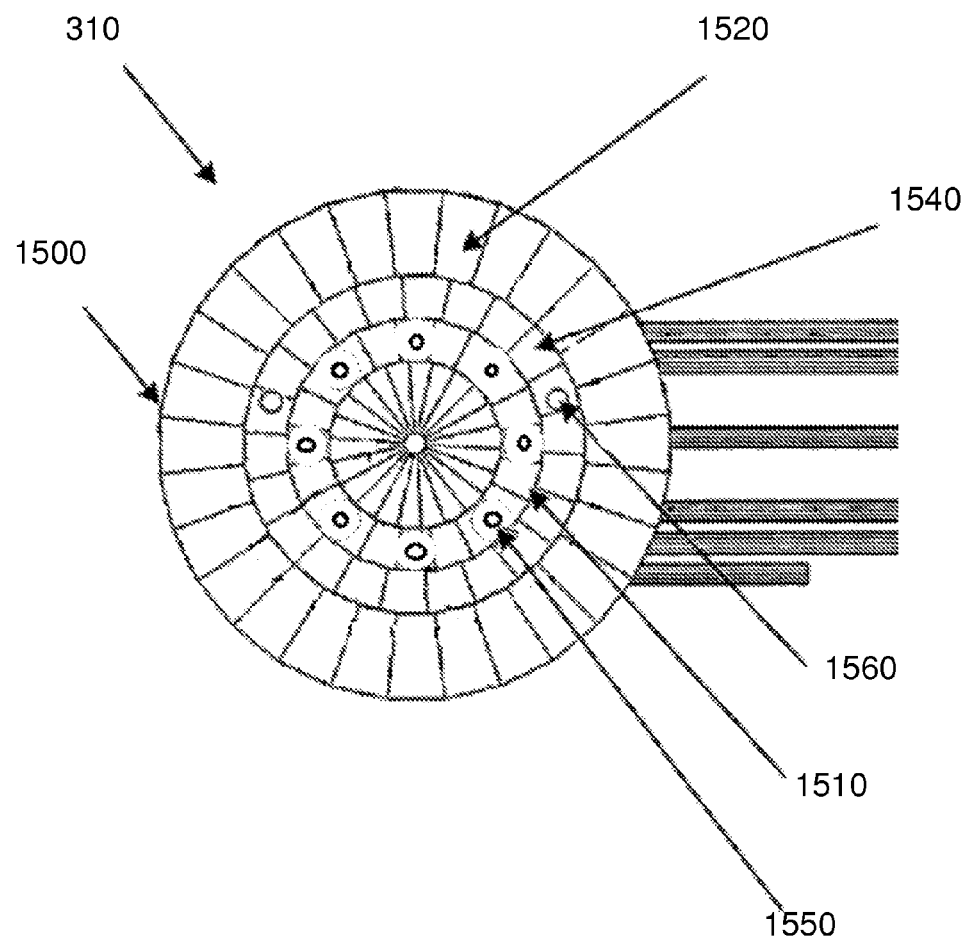
FIG. 15A Illustrates an example of the close up illustration of the connections for tool connections of FIG. 3 that may be used for connecting a component assembly according to some examples of the present disclosure.

Referring to FIG. 15A, a close up view of a flange 1500 which is a magnified illustration of the tool connections 310 is presented. The flange 1500 may have multiple primary sealing surfaces 1510 as illustrated for the surface regions around each of the illustrated multiple primary connection points 1550. In some examples, where the flange 1500 is a second flange of a flange set, these surface regions may be referred to as a second sealing surface or a second primary sealing surface and the attachment of "second" as an identifying prefix to each of the elements of the flange 1400 may also be made. There may be a secondary sealing surface 1520 and in some examples there may be more than one secondary sealing surface 1520. In some examples, there may be a channel 1540 that may also interface with a fixture for connecting a fluid drain 1560 to the channel 1540. The channel 1540 may be operative for maintaining a negative atmospheric pressure around a seal. In some examples the seal may contain a chemical gas or liquid. In some examples, there may be primary connection points 1550.

Figure 15B:
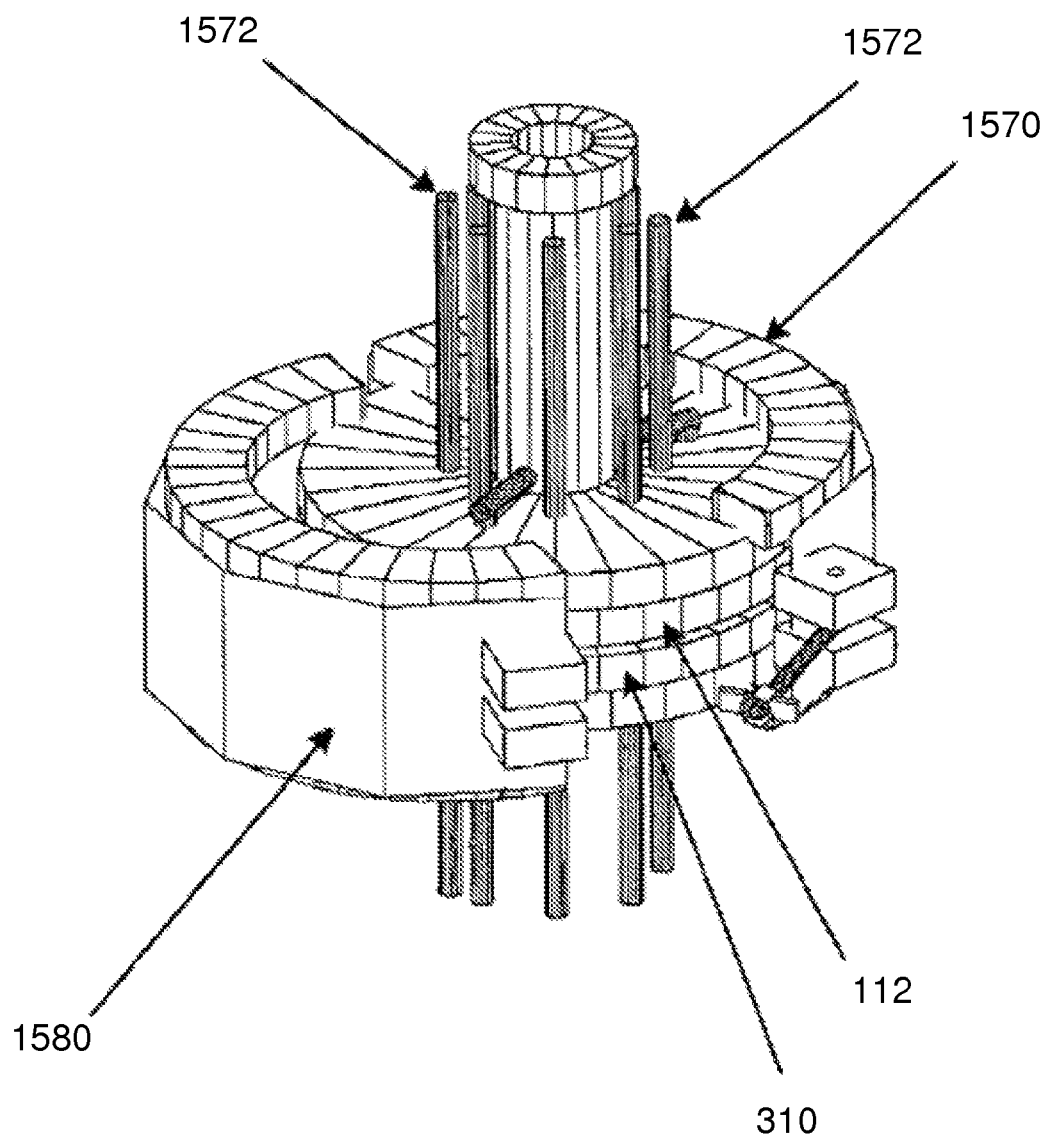
FIG. 15B Illustrates a flange set with the coupling of a primary and a secondary set of connections for non-electrical utilities of FIG. 1 and tool connections of FIG. 3 that may be used for connecting a component assembly according to some examples of the present disclosure.

Referring to FIG. 15B, an illustration may be found of a flange set which may in some treatments be considered a flange 1570 in its own right may comprise a combination of a first flange 1400 and a second flange 1500. The flange set may be a mated combination of the connections for non-electrical utilities 121 and tool connections 310. The flange set may have multiple primary connection points respectively on each of the first flange 1400 and second flange 1500. These connection points may connect to respective multiple conduits 1572. In some examples, there may be a fastener 1580 which may be operant for holding the first sealing surface proximate to the second sealing surface, in this sense the fastener 1580 may hold the first sealing surface and the second sealing surface. This combination of flanges may be operative to connect utility service conduits to a component assembly. In some examples, the utility service conduits may comprise one or more utility services comprising one or more of chemical gas supply and liquid supply. Each discrete utility service may be connected through the flanges each of which may have a primary sealing surface associated with the supply of the discrete utility service.

A secondary sealing surface, such as secondary sealing surface 1420 or secondary sealing surface 1520 may be operative to seal a gas or liquid that may be leaking from a primary sealing surface, such as the multiple primary sealing surfaces 1410 or the multiple primary sealing surfaces 1510. The operative aspect may comprise sealing the leaking gas or liquid from entering an ambient atmosphere. The flanges may comprise channels such as channel 1440 and channel 1540 that may maintain a negative atmospheric pressure around a seal containing the chemical gas. The negative atmospheric pressure may operate to evacuate any chemical gas leaking from the seal to an area external to the cleanspace. The channel may be contiguous and may circumvent an aggregate of the primary connection points. The channel may be sealed by a channel seal, such as the circular rubber seal 1430 which may atmospherically seal an interior area which may be defined by the channels of the first flange and the second flange. The channels, such as channel 1440 and channel 1540 may have a fixture such as fixture 1460 for connecting a source negative atmospheric pressure to the channel. In some examples, an electronic sensor 1470 may monitor one or more fluids leaking from the various sealing surfaces.

Figure 16:
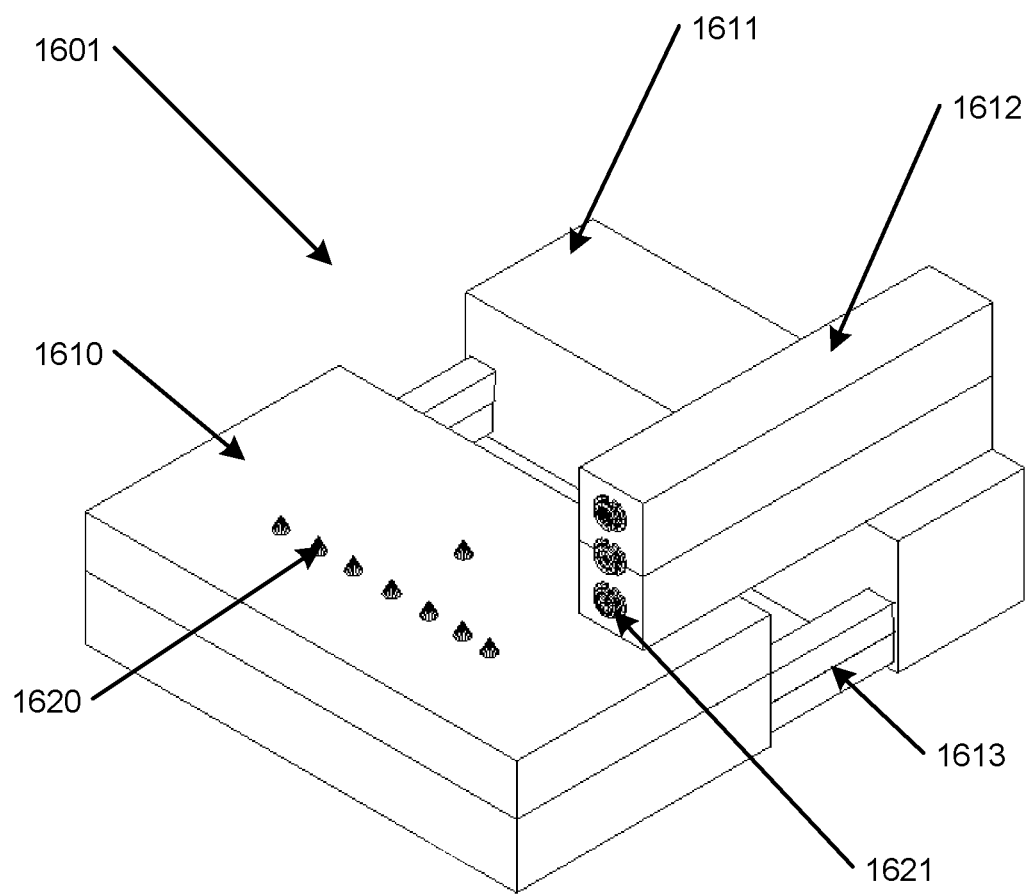
FIG. 16 illustrates an apparatus operative to physically remove and install a component assembly into a processing tool.

Referring now to FIG. 16, an apparatus for positioning a component assembly 1330 portion of a tool is illustrated it includes a chassis 1601 according to some embodiments of the present invention. Base plates may be attached to a sliding rail system 1613 to provide an installation location for a component assembly 1330 (not illustrated in FIG. 16). Base plate 1611 may be physically fixed in an appropriate location of a processing tool. In some embodiments, base plate 1611 may not interact directly with the component assembly. In some embodiments, chassis plate 1610 can physically support a component assembly 1330 mounted on the chassis 1601. A component assembly may be mounted so that the component assembly is located within a processing tool which itself is located on the periphery of a cleanspace.

In some embodiments, tabs 1620 may stick out of the top of the chassis plate 1610. The tabs 1620 may serve one or more purposes. As a physical extension, the tabs 1620 will have a corresponding indentation (not illustrated) in the mating plate or a surface of a component assembly 1330 to be placed on the tabs 1620. As the component assembly 1330 is lowered over the chassis plate 1610, the component assembly 1330 will reach a location as defined by tabs 1620. In some embodiments, the tabs 1620 can additionally provide electrical connection between the chassis plate 1610 and the component assembly 1330. Electrical connection can serve one or more of the purposes of: electrical power and electrical data signal.

Connections for 1621 can also be provided, Connections for utilities 1621 can be used for defining a connection, for example, of one or more of: chemical gas supply; liquid supply; and electric power supply. Various conduits 1612 can carry these utilities to the connections for non-electrical utilities 1621 and be routed, for example, through the chassis 1601.

GLOSSARY OF SELECTED TERMS

Air receiving wall: a boundary wall of a cleanspace that receives air flow from the cleanspace.

Air source wall: a boundary wall of a cleanspace that is a source of clean airflow into the cleanspace.

Annular: The space defined by the bounding of an area between two closed shapes one of which is internal to the other.

Automation: The techniques and equipment used to achieve automatic operation, control or transportation.

Ballroom: A large open cleanroom space devoid in large part of support beams and walls wherein tools, equipment, operators and production materials reside.

Batches: A collection of multiple substrates to be handled or processed together as an entity Boundaries: A border or limit between two distinct spaces—in most cases herein as between two regions with different air particulate cleanliness levels.

Circular: A shape that is or nearly approximates a circle.

Clean: A state of being free from dirt, stain, or impurities—in most cases herein referring to the state of low airborne levels of particulate matter and gaseous forms of contamination.

Cleanspace: A volume of air, separated by boundaries from ambient air spaces, that is clean.

Cleanspace, Primary: A cleanspace whose function, perhaps among other functions, is the transport of jobs between tools.

Cleanspace, Secondary: A cleanspace in which jobs are not transported but which exists for other functions, for example as where tool bodies may be located.

Cleanroom: A cleanspace where the boundaries are formed into the typical aspects of a room, with walls, a ceiling and a floor.

Core: A segmented region of a standard cleanroom that is maintained at a different clean level. A typical use of a core is for locating the processing tools.

Ducting: Enclosed passages or channels for conveying a substance, especially a liquid or gas—typically herein for the conveyance of air.

Envelope: An enclosing structure typically forming an outer boundary of a cleanspace.

Fab (or fabricator): An entity made up of tools, facilities and a cleanspace that is used to process substrates.

Fit up: The process of installing into a new clean room the processing tools and automation it is designed to contain.

Flange: A protruding rim, edge, rib, or collar, used to strengthen an object, hold it in place, or attach it to another object. Typically herein, also to seal the region around the attachment.

Folding: A process of adding or changing curvature.

HEPA: An acronym standing for high-efficiency particulate air. Used to define the type of filtration systems used to clean air.

Horizontal: A direction that is, or is close to being, perpendicular to the direction of gravitational force.

Job: A collection of substrates or a single substrate that is identified as a processing unit in a fab. This unit being relevant to transportation from one processing tool to another.

Logistics: A name for the general steps involved in transporting a job from one processing step to the next. Logistics can also encompass defining the correct tooling to perform a processing step and the scheduling of a processing step.

Multifaced: A shape having multiple faces or edges.

Nonsegmented Space: A space enclosed within a continuous external boundary, where any point on the external boundary can be connected by a straight line to any other point on the external boundary and such connecting line would not need to cross the external boundary defining the space.

Perforated: Having holes or penetrations through a surface region. Herein, said penetrations allowing air to flow through the surface.

Peripheral: Of, or relating to, a periphery.

Periphery: With respect to a cleanspace, refers to a location that is on or near a boundary wall of such cleanspace. A tool located at the periphery of a primary cleanspace can have its body at any one of the following three positions relative to a boundary wall of the primary cleanspace: (i) all of the body can be located on the side of the boundary wall that is outside the primary cleanspace, (ii) the tool body can intersect the boundary wall or (iii) all of the tool body can be located on the side of the boundary wall that is inside the primary cleanspace. For all three of these positions, the tool's port is inside the primary cleanspace. For positions (i) or (iii), the tool body is adjacent to, or near, the boundary wall, with nearness being a term relative to the overall dimensions of the primary cleanspace.

Planar: Having a shape approximating the characteristics of a plane.

Plane: A surface containing all the straight lines that connect any two points on it.

Polygonal: Having the shape of a closed figure bounded by three or more line segments Process: A series of operations performed in the making or treatment of a product—herein primarily on the performing of said operations on substrates.

Robot: A machine or device, that operates automatically or by remote control, whose function is typically to perform the operations that move a job between tools, or that handle substrates within a tool.

Round: Any closed shape of continuous curvature.

Substrates: A body or base layer, forming a product, that supports itself and the result of processes performed on it.

Tool: A manufacturing entity designed to perform a processing step or multiple different processing steps. A tool can have the capability of interfacing with automation for handling jobs of substrates. A tool can also have single or multiple integrated chambers or processing regions. A tool can interface to facilities support as necessary and can incorporate the necessary systems for controlling its processes.

Tool Body: That portion of a tool other than the portion forming its port.

Tool Port: That portion of a tool forming a point of exit or entry for jobs to be processed by the tool. Thus the port provides an interface to any job-handling automation of the tool.

Tubular: Having a shape that can be described as any closed figure projected along its perpendicular and hollowed out to some extent.

Unidirectional: Describing a flow which has a tendency to proceed generally along a particular direction albeit not exclusively in a straight path. In clean airflow, the unidirectional characteristic is important to ensuring particulate matter is moved out of the cleanspace.

Unobstructed removability: refers to geometric properties, of fabs constructed in accordance with the present invention, that provide for a relatively unobstructed path by which a tool can be removed or installed.

Utilities: A broad term covering the entities created or used to support fabrication environments or their tooling, but not the processing tooling or processing space itself. This includes electricity, gasses, airflows, chemicals (and other bulk materials) and environmental controls (e.g., temperature).

Vertical: A direction that is, or is close to being, parallel to the direction of gravitational force.

While the invention has been described in conjunction with specific embodiments, it is evident that many alternatives, modifications and variations will be apparent to those skilled in the art in light of the foregoing description.

Accordingly, this description is intended to embrace all such alternatives, modifications and variations as fall within its spirit and scope.

What is claimed is:

1. An apparatus for processing a substrate comprising:
   a fabricator comprising:
   a primary cleanspace comprising a first wall;
   a first processing tool configured to process the substrate comprising a tool body and a tool port, said tool body comprising a component assembly, and wherein the first processing tool is on an exterior periphery of the primary cleanspace first wall, and wherein the tool port is that part of the first processing tool forming a point of exit or entry for the substrate to be processed within the primary cleanspace;
   a chassis for positioning at least the component assembly of the first processing tool, said chassis comprising an extended position and an operating position;
   wherein the chassis comprises a chassis plate for mounting at least the component assembly onto, the chassis plate comprising a mating surface for receiving the component assembly; and
   wherein the extended position of the chassis facilitates access and replacement of the component assembly from a periphery of the first processing tool while the first processing tool is spaced apart external to the primary cleanspace first wall, and the tool port does not penetrate through the first wall and is not positioned within the primarily cleanspace; and
   wherein the operating position of the chassis places the component assembly into the first processing tool and the tool port penetrates through the first wall to be positioned within the primary cleanspace, while the tool body does not penetrate through the first wall and is not positioned within the primarily cleanspace.

2. The apparatus of claim 1 wherein the mating surface comprises tabs protruding from the surface, wherein the tabs are functional for aligning the component assembly received thereon.

3. The apparatus of claim 2 wherein the tabs are additionally operative for providing electrical connection for one or more of: electrical power and data signal to terminals comprising the component assembly.

4. The apparatus of claim 1 additionally comprising a flange operative to connect utility service conduits to the component assembly, said utility services comprising one or more of: chemical gas supply; liquid supply; electric power supply; and data signal connection.

5. The apparatus of claim 4 wherein the flange comprises multiple primary sealing surfaces, each said primary sealing surface for supply of a discrete utility service.

6. The apparatus of claim 5 wherein the flange additionally comprises one or more secondary sealing surfaces operative to seal a material leaking from each said primary sealing surface from entering an ambient atmosphere.

7. The apparatus of claim 4 wherein the flange additionally comprises a channel for maintaining a negative atmospheric pressure around a seal containing the chemical gas, said negative atmospheric pressure operative to evacuate any chemical gas leaking from the seal to an area external to the primary cleanspace.

8. The apparatus of claim 1 additionally comprising a rail on which the chassis can slide from the extended position to the operating position.

9. An apparatus comprising a fabricator with a flange set for connecting a component assembly to a processing tool, the apparatus comprising:
   the fabricator comprising a vertically oriented cleanspace having a first wall;
   the processing tool configured to process a substrate, within the fabricator, comprising a tool body and a tool port, wherein the tool port is that portion of the processing tool forming a point of exit or entry for the substrate to be processed by the processing tool;
   the component assembly proximate to a periphery of the vertically oriented cleanspace first wall;
   a chassis for positioning at least the component assembly of the processing tool, said chassis comprising an extended position and an operating position;
   wherein the chassis comprises a chassis plate for mounting at least the component assembly onto, the chassis plate comprising a mating surface for receiving the component assembly;
   wherein the extended position of the chassis facilitates access and replacement of the component assembly from a periphery of the processing tool while the processing tool is spaced apart external to the vertically oriented cleanspace first wall, and the tool port does not penetrate through the first wall and is not positioned within the vertically oriented cleanspace;
   wherein the operating position of the chassis places the component assembly into the processing tool and the tool port penetrates through the first wall to be positioned within the vertically oriented cleanspace, while the tool body does not penetrate through the first wall and is not positioned within the vertically oriented cleanspace;

the flange set comprising:
- a first sealing surface connected to multiple conduits, with a primary connection point for each said conduit formed in the first sealing surface,
- a second sealing surface with multiple secondary connection points, each said secondary connection point positioned to interface with a respective said primary connection point,
- a seal attached to one or more said primary connection point, wherein said attachment of the seal isolates an interior defined by the seal from an exterior defined by the seal,
- one or more areas formed about each said secondary connection point for receiving each respective said seal when the first sealing surface is brought proximate to the second sealing surface,
- a fastener for holding the first sealing surface and the second sealing surface;
- wherein the flange set facilitates access and replacement of the component assembly from the periphery of the vertically oriented cleanspace first wall.

10. The apparatus of claim 9 additionally comprising:
a contiguous channel circumventing an aggregate of the primary connection points;
a channel seal atmospherically sealing an interior area defined by the contiguous channel;
a fixture for connecting a source negative atmospheric pressure to the contiguous channel; and
at least one electronic sensor operative to monitor one or more gases leaking from the primary connection points.

11. The apparatus of claim 9 additionally comprising:
a contiguous channel circumventing an aggregate of the primary connection points;
a channel seal atmospherically sealing an interior area defined by the contiguous channel;
a fixture for connecting a fluid drain to the contiguous channel; and
electronic sensors operative to monitor one or more fluids leaking from the first sealing surface or the second sealing surface.

12. The apparatus of claim 1 additionally comprising a substrate carrier, wherein the substrate carrier is handed off to the tool port.

13. The apparatus of claim 9 additionally comprising a substrate carrier, wherein the substrate carrier is handed off to the tool port.

\* \* \* \* \*